US 6,747,323 B2

(12) United States Patent
Komori

(10) Patent No.: US 6,747,323 B2
(45) Date of Patent: Jun. 8, 2004

(54) STATIC SEMICONDUCTOR MEMORY DEVICE

(75) Inventor: Shigeki Komori, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/330,168

(22) Filed: Dec. 30, 2002

(65) Prior Publication Data
US 2003/0132490 A1 Jul. 17, 2003

Related U.S. Application Data

(63) Continuation of application No. 09/765,637, filed on Jan. 22, 2001, now Pat. No. 6,507,079.

(30) Foreign Application Priority Data

Jul. 18, 2000 (JP) .......................................... 2000-217076

(51) Int. Cl.[7] .............................................. H01L 29/76
(52) U.S. Cl. ..................................... 257/393; 257/903
(58) Field of Search ................................ 257/393, 903, 257/382, 371, 904

(56) References Cited

U.S. PATENT DOCUMENTS

| 4,774,203 A | | 9/1988 | Ikeda et al. | |
|---|---|---|---|---|
| 5,304,833 A | * | 4/1994 | Shigeki et al. | 257/372 |
| 6,130,470 A | | 10/2000 | Selcuk | |
| 6,144,076 A | * | 11/2000 | Puchner et al. | 257/369 |
| 6,329,693 B1 | * | 12/2001 | Kumagai | 257/903 |
| 6,507,079 B2 | * | 1/2003 | Komori | 257/393 |

FOREIGN PATENT DOCUMENTS

| JP | 61-139059 | 6/1986 |
|---|---|---|
| JP | 2-295164 | 12/1990 |
| JP | 6-275796 | 9/1994 |

* cited by examiner

Primary Examiner—Mark V. Prenty
(74) Attorney, Agent, or Firm—McDermott, Will & Emery

(57) ABSTRACT

A static semiconductor memory device capable of preventing soft errors is provided. The static semiconductor memory device includes: a silicon substrate having a p-type well region; a storage node; an n-type-low-concentration impurity region and a high-concentration impurity region formed in the surface of p-type well region and connected to storage node; and a p-type impurity region formed to have contact with high-concentration impurity region.

2 Claims, 29 Drawing Sheets

STATIC SEMICONDUCTOR MEMORY DEVICE

This application is a continuation of application Ser. No. 09/765,637 filed Jan. 22, 2001, now U.S. Pat. No. 6,507,079.

BACKGROUND OF THE INVENTION

1. Field of the Invention

The present invention relates to static semiconductor memory devices (hereinafter abbreviated as "SRAMs") and, more particularly, to an SRAM capable of preventing soft errors.

2. Description of the Background Art

In recent years, semiconductor devices of portable apparatuses are required to operate at less energy and low voltage to provide longer battery life. Accordingly, the demand for SRAMs designed for low voltage operation with less power consumption has been on the increase. Such SRAMs for low voltage operation generally have six transistors and usually employ what is called a full CMOS (Complementary Metal-Oxide Semiconductor) memory cell.

FIG. 39 shows an equivalent circuit of a conventional SRAM memory cell. Referring to FIG. 39, a memory cell 100z of the SRAM includes n channel drive transistors 101 and 104, p channel load transistors 102 and 105, and n channel access transistors 103 and 106.

Memory cell 100z is connected to bit lines 171 and 172, a word line 199, a power supply node 175, and ground nodes 173 and 174. In memory cell 100z of the SRAM, drive transistors 101 and 104 as well as load transistors 102 and 105 form a flip flop circuit.

Load transistor 102 has its source region connected to power supply node 175 and drain region connected to a storage node 116. A gate electrode 111 of load transistor 105 is connected to a storage node 115.

Load transistor 105 has its source region connected to power supply node 175 and drain region connected to storage node 115. A gate electrode 112 of load transistor 105 is connected to storage nodes 116.

Drive transistor 101 has its source region connected to a ground node 173 and drain region connected to storage node 116. Gate electrode 111 of drive transistor 101 is connected to storage node 115.

Drive transistor 104 has its source region connected to a ground node 174 and drain region connected to storage node 115. Gate electrode 112 of drive transistor 104 is connected to storage node 116.

A gate electrode 113 of access transistor 103 is connected to word line 199. One of source and drain regions of access transistor 103 is connected to bit line 171, and the other connected to storage node 116.

Gate electrode 113 of access transistor 106 is connected to word line 199. One of source and drain regions of access transistor 106 is connected to bit line 172, and the other connected to storage node 115.

As shown in FIG. 39, memory cell 100z of the SRAM has an inverter formed by drive transistor 101 of an n channel transistor and a load transistor 102 of a p channel transistor. Further, it has an inverter formed by drive transistor 104 of an n channel transistor and load transistor 105 of a p channel transistor. These two inverters are combined and connected. An output of each inverter is an output of the other inverter, creating a stabilized state. These outputs are further connected to bit lines 171 and 172 through access transistors 103 and 106. When access transistors 103 and 106 are turned on, data are written to or read from bit lines 171 and 172.

In memory cell 100z shown in FIG. 39, when a potential at storage node 116 is relatively high, a potential at storage node 115 is relatively low. On the contrary, when the potential at storage node 116 is relatively low, the potential at storage node 115 is relatively high. These two states are used for storage of the presence of data.

FIG. 40 shows a plan view of the memory cell of the conventional SRAM shown in FIG. 39. Referring to FIG. 40, memory cell 100z of the SRAM includes a pair of load transistors 102 and 105, a pair of drive transistors 101 and 104, and a pair of access transistors 103 and 106.

Access transistor 103 has a pair of n-type impurity regions formed in an active region 130, and gate electrode 113. One of the impurity regions is connected to bit line 171 through contact hole 303, and the other connected to storage node 116 through a contact hole 302.

Access transistor 106 has a pair of n-type impurity regions formed in an active region 150, and gate electrode 113. One of the impurity regions is connected to bit line 172 through a contact hole 309, and the other connected to storage node 115 through a contact hole 206.

Drive transistor 101 has a pair of n-type impurity regions formed in active region 130, and gate electrode 111. One of the impurity regions is connected to ground node 173 through a contact hole 307, and the other connected to storage node 116 through contact hole 302.

Drive transistor 104 has a pair of n-type impurity regions formed in an active region 150, and gate electrode 112. One of the impurity regions is connected to ground node 174 through a contact hole 308, and the other connected to storage node 115 through contact hole 206.

Load transistor 102 has a pair of p-type impurity regions formed in an active region 140, and gate electrode 111. One of the impurity regions is connected to storage node 116 through a contact hole 301, and the other connected to power supply node 173 through a contact hole 305.

Load transistor 105 has a pair of p-type impurity regions formed in an active region 160, and gate electrode 112. One of the impurity regions is connected to storage node 115 through a contact hole 205, and the other connected to power supply node 175 through a contact hole 306.

FIG. 41 is a cross sectional view taken along the line XLI—XLI in FIG. 40. Referring to FIG. 40, an isolation oxide film 2 is formed above a silicon substrate 1. A p-type well region 107p and an n-type well region 108n are formed on the surface of silicon substrate 1. Active region 130 is formed in p-type well region 107p. Formed in p-type well region 107p are a pair of low-concentration impurity regions 131a and 131b as well as a pair of high-concentration impurity regions 132a and 132b, with each pair of regions being spaced apart from each other. Low-concentration impurity regions 131a, 131b and high-concentration impurity regions 132a, 132b form what is called an LDD (Lightly Doped Drain) structure. A channel dope region 133p of a p-type impurity region is formed between the pair of low-concentration impurity regions 131a and 131b.

Gate electrode 113 is formed on silicon substrate 1 with a gate insulative film 113a interposed. A side surface of gate electrode 113 is covered with a sidewall oxide film 121 and an upper surface thereof is covered with an upper oxide film 122. Gate electrode 111 is formed on isolation oxide film 2. Gate electrode 111 is also covered with sidewall oxide film 121 and upper oxide film 122.

Active region 140 is formed in n-type well region 108n. Active region 140 has p type low-concentration impurity region 141a and p type high-concentration impurity region 142a.

An interlayer insulative film 200 is formed to cover silicon substrate 1. Formed in interlayer insulative film 200 are contact holes 204, 203, 202, and 201, respectively reaching low-concentration impurity regions 131a, 131b, gate electrode 111, and low-concentration impurity region 141a. Plug layers 221 to 224 are respectively formed in contact holes 201 to 204. Pad electrodes 211, 212, and 213 are formed on interlayer insulative film 200 respectively to have contact with plug layers 221, 223, and 224. Storage node 115 is formed on interlayer insulative film 200 to have contact with plug layer 222.

An interlayer insulative film 300 is formed to cover interlayer insulative film 200. Formed in interlayer insulative film 303 are contact holes 301, 302, and 303, respectively reaching pad electrodes 211, 212, and 213. Plug layers 321 to 323 are respectively formed in contact holes 301 to 303. Storage node 116 is formed to have contact with plug layers 321 and 322. Bit line 171 and power supply node 175 are formed on interlayer insulative film 300.

Memory cells may suffer from a so-called a soft error phenomenon, where radiation is directed from radioactive elements contained in a package or the like, thereby causing data loss. For a DRAM (Dynamic Random Access Memory), for example, it is known that electric charges accumulated in a capacitor are neutralized by those generated by α rays, thereby causing data loss. It is also known that the above mentioned SRAM suffers from the soft error phenomenon where a stored content is inverted by electric charges caused by α rays. Particularly in recent years, miniaturization of semiconductor devices tends to reduce the amount of electric charges to be accumulated, whereby the devices are more likely to be subjected to data inversion.

FIG. 42 is a diagram shown in conjunction with the problem of the conventional SRAM. Referring to FIG. 42, when ax rays are externally directed to the memory cell of the SRAM in the direction indicated by an arrow 220, these α rays produce electrons 10e and holes 10h in silicon substrate 1. Here, assume that electric charges are accumulated in storage node 116 and the potential at storage node 116 is relatively high. In this state, if α rays are directed in the direction indicated by arrow 220, electrons 10e and holes 10h are produced in silicon substrate 1. The produced electrons move to high-concentration impurity region 132b with relatively high potential, whereby the potential at the high-concentration impurity region 132b becomes relatively low. Consequently, the potential at storage node 116 becomes relatively low, whereby the potential at the storage node 116 is inverted to what is called Vss potential. Thus, the problem associated with the soft error of data loss arises.

SUMMARY OF THE INVENTION

Therefore, the present invention is made to solve the aforementioned problems. An object of the present invention is to provide a static semiconductor memory device capable of preventing soft errors despite of its miniaturized structure.

A static semiconductor memory device according to one aspect of the present invention includes a semiconductor substrate, a storage node, an impurity region of a second conductivity type, and an impurity region of a first conductivity type. The semiconductor substrate has a semiconductor region of the first conductivity type. The storage node is formed on the semiconductor substrate. The impurity region of the second conductivity type is formed on a surface of the semiconductor region and electrically connected to the storage node. The impurity region of the first conductivity type is formed in the semiconductor region to have contact with the impurity region of the second conductivity type.

In thus formed static semiconductor memory device, the impurity region of the second conductivity type electrically connected to the storage node and the impurity region of the first conductivity type are formed in contact with each other, so that the impurity regions of the second and first conductivity types have capacitances. Accordingly, electric charges accumulated in the impurity region of the second conductivity type and the storage node attract those of the opposite conductivity type in the impurity region of the first conductivity type, whereby loss of electric charges accumulated in the impurity region of the second conductivity type is prevented. As a result, inversion of the stored information is less likely to occur and the problem associated with the soft errors can be prevented.

A static semiconductor memory device according to another aspect of the present invention includes a semiconductor substrate, a storage node, a field effect transistor, and a pair of impurity regions of a first conductivity type. The semiconductor substrate has a semiconductor region of the first conductivity type. The storage node is formed on the semiconductor substrate. The field effect transistor is formed in the semiconductor region. The field effect transistor includes a gate electrode and a pair of source and drain regions. The gate electrode is formed on the semiconductor region with a gate insulative film interposed. The pair of source and drain regions is formed in the semiconductor region on both sides of the gate electrodes and formed of impurity regions of a second conductivity type. One of the pair of source and drain regions is electrically connected to the storage node. The pair of impurity regions of the first conductivity type is positioned under the source and drain regions. An impurity concentration of the pair of impurity regions of the first conductivity type is higher than that of a region between the pair of impurity regions of the first conductivity type.

In the static semiconductor memory device having the above-described structure, the impurity region of the first conductivity type is formed under the source and drain regions electrically connected to the storage node. Thus, the impurity region of the first conductivity type and the source and drain regions of the impurity region of the second conductivity type have capacitances. As a result, electric charges accumulated in the storage node and the source and drain regions attract electric charges of the opposite conductivity type in the impurity region of the first conductivity type, so that loss of electric charges is prevented. Consequently, inversion of stored information is less likely to occur and the problem associated with so-called soft errors can be prevented.

Further, in the region positioned below the source and drain regions, the concentration of the pair of impurity region of the first conductivity type is higher than that of the impurity region of the first conductivity type positioned therebetween. Thus, the impurity region of the first conductivity type and the source and drain regions have greater coupling capacitance. Between the pair of impurity regions of the first conductivity type, i.e., below the gate electrode, the impurity concentration of the first conductivity type is low enough not to affect the channel region. As a result, a threshold value of the field effect transistor would not change.

A static semiconductor memory device according to still another aspect of the present invention includes a semiconductor substrate and a storage node. The storage node is formed on the semiconductor substrate. The storage node has a first storage node portion extending in a prescribed direction, and a second storage node portion formed opposite to and on the first storage node portion with a dielectric material interposed and extending in the same direction as the first storage node portion.

In the static semiconductor memory device having the above-described structure, the storage node has the first and second storage node portions, which are formed opposite to each other with the dielectric material interposed. Thus, the first and second storage node portions have capacitances. As a result, electric charges accumulated in one of the first and second storage node portions attract those of the opposite conductivity type of the other, so that loss of electric charges accumulated in the storage node can be prevented. Therefore, the problem associated with soft errors would not arise. Further, since the second storage node portion extends in the same direction as the first storage node portion, the first and second storage node portions are arranged opposite to each other over a greater area. As a result, soft errors can be prevented more effectively.

Preferably, the static semiconductor memory device further includes a region with substantially constant potential formed in the semiconductor substrate. The first storage node portion is electrically connected to the region with substantially constant potential. In this case, the potential at the first storage node remains substantially constant, so that the potential at the second storage node can be more stabilized as compared with the case where the potential at the first storage node varies. Thus, it is ensured that electric charges are accumulated in the second storage node.

More preferably, the first storage node portion is formed over almost entire region of the second storage node portion when viewed from above. Then, in particular, the first and second storage node portions are arranged opposite to each other over a greater area, so that the coupling capacitance of the first and second storage node portions increases. As a result, soft errors can be prevented more effectively.

More preferably, the static semiconductor memory device further includes a load transistor and a drive transistor. The storage node is a gate electrode of the load or drive transistor.

More preferably, the static semiconductor memory device further includes a pair of drive transistors. The storage node electrically connects the gate electrode of one drive transistor and the drain region of the other drive transistor.

A static semiconductor memory device according to still another aspect of the present invention includes a semiconductor substrate, a semiconductor region of a first conductivity type, a semiconductor region of a second conductivity type, and a field effect transistor. The semiconductor region of the first conductivity type is formed in the semiconductor substrate. The semiconductor region of the second conductivity type is formed in the semiconductor substrate to have contact with the semiconductor region of the first conductivity type. The field effect transistor has a channel region of the first conductivity type formed in the semiconductor region of the first conductivity type. The semiconductor region of the second conductivity type is in contact with the semiconductor region of the first conductivity type and includes a first extension region extending toward the channel region.

In the static semiconductor memory device having the above-described structure, the second semiconductor region has the first extension region extending toward the channel region, so that any carriers caused by α rays near the channel region can be absorbed into the first extension region. As a result, the storage node connected to the semiconductor region of the first conductivity type would not be adversely affected by the carriers. Consequently, soft errors can be prevented.

More preferably, a potential different from that of the semiconductor region of the first conductivity type is applied to the semiconductor region of the second conductivity type to attract carriers of the second conductivity type. In this case, even if carriers of the second conductivity type are caused in the semiconductor region of the first conductivity type, these carriers of the second conductivity type are attracted from the semiconductor region of the first conductivity type to the semiconductor region of the second conductivity type through the first extension region. As a result, the carriers of the second conductivity type would not adversely affect the transistor formed in the semiconductor region of the first conductivity type. Consequently, soft errors can be more reliably prevented.

More preferably, the semiconductor region of the second conductivity type further includes a second extension region covering the semiconductor region of the first conductivity type. Then, the second extension region surrounds the semiconductor region of the first conductivity type, so that soft errors can be prevented more effectively.

A static semiconductor memory device according to still another aspect of the present invention includes a semiconductor substrate, a gate electrode, a sidewall dielectric film, source and drain regions, and a conductive layer. The gate electrode is formed on the semiconductor substrate with a gate insulative film interposed and electrically connected to a storage node. The sidewall dielectric film is formed to be in contact with the sidewall of the gate electrode. The source and drain regions are formed on the semiconductor substrate on both sides of the gate electrode. The conductive layer is connected to one of the source and drain regions and formed on the gate electrode with the sidewall dielectric film interposed.

In the static semiconductor memory device having the above-described structure, the conductive layer is formed on the gate electrode with the sidewall insulative film interposed, so that the conductive layer and the gate electrode have capacitances. Since the gate electrode is electrically connected to the storage node, electric charges accumulated in the storage node and the gate electrode attract electric charges of the opposite conductivity type in the conductive layer. As a result, loss of electric charges accumulated in the storage node and gate electrode can be prevented. Thus, soft errors are prevented.

More preferably, the potential of the conductive layer remains substantially constant. Then, electric charges can be accumulated stably in the gate electrode and the storage node.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described with reference to the drawings.

First Embodiment

Figure 1:
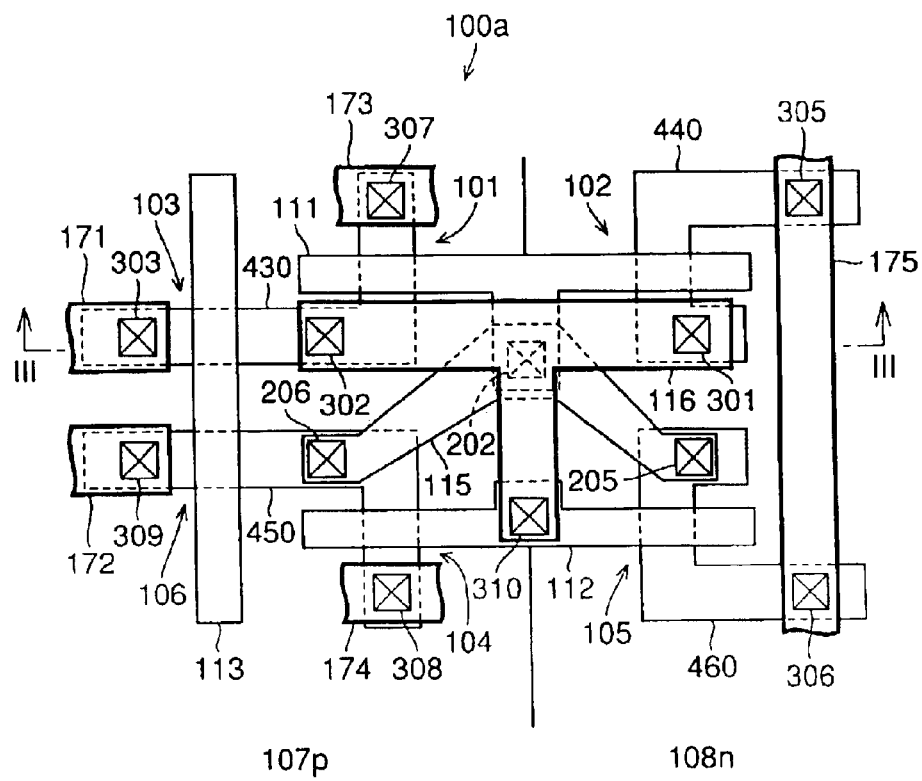
FIG. 1 is a plan view showing an SRAM according to a first embodiment of the present invention.

Referring to FIG. 1, a memory cell 100a according to the first embodiment of the present invention includes a pair of load transistors 102 and 105, a pair of drive transistors 101 and 104, and a pair of access transistors 103 and 106.

Access transistor 103 has a pair of n-type impurity regions formed in an active region 403 and a gate electrode 113. One of the impurity regions is connected to a bit line 171 through a contact hole 303, and the other connected to a storage node 116 through a contact hole 302.

Access transistor 106 has a pair of n-type impurity regions formed in an active region 450 and a gate electrode 113. One of the impurity regions is connected to a bit line 172 through a contact hole 309, and the other connected to a storage node 115 through a contact hole 206.

Drive transistor 101 has a pair of n-type impurity regions formed in an active region 430 and a gate electrode 111. One of the impurity regions is connected to a ground node 173 through a contact hole 307, and the other connected to storage node 116 through a contact hole 302.

Drive transistor 104 has a pair of n-type impurity regions formed in an active region 450 and a gate electrode 112. One of the impurity regions is connected to a ground node 174 through a contact hole 308, and the other connected to storage node 115 through a contact hole 206.

Load transistor 102 has a pair of p-type impurity regions formed in an active region 440 and gate electrode 111. One of the impurity regions is connected to storage node 116 through a contact hole 301, and the other connected to a power supply node 175 through a contact hole 305.

Load transistor 105 has a pair of p-type impurity regions formed in an active region 460 and gate electrode 112. One of the impurity regions is connected to storage node 115 through a contact hole 205, and the other connected to power supply node 175 through a contact hole 306.

Load transistors 102 and 105 are formed in an n-type well region 108n. Drive transistors 101 and 104 as well as access transistors 103 and 106 are formed in a p-type well region 107p. Load transistor 102, drive transistor 101 and access transistor 103 positioned on the upper side of the drawing, as well as load transistor 105, drive transistor 104 and access transistor 106 on the lower side of the drawing are symmetrically formed.

Gate electrode 111 is shared by load transistor 102 and drive transistor 101. Gate electrode 112 is shared by load transistor 105 and drive transistor 104. Gate electrode 113 is shared by access transistors 103 and 106. Contact hole 202 connects gate electrode 111 and storage node 115. Contact hole 310 connects gate electrode 112 and storage node 116.

Gate electrodes 111 and 112 are each formed in a "T" like shape, opposite to each other. Storage node 115 in a "V" like shape is formed on gate electrodes 111 and 112. Storage node 116 in a "T" like shape is formed on storage node 115.

Figure 2:
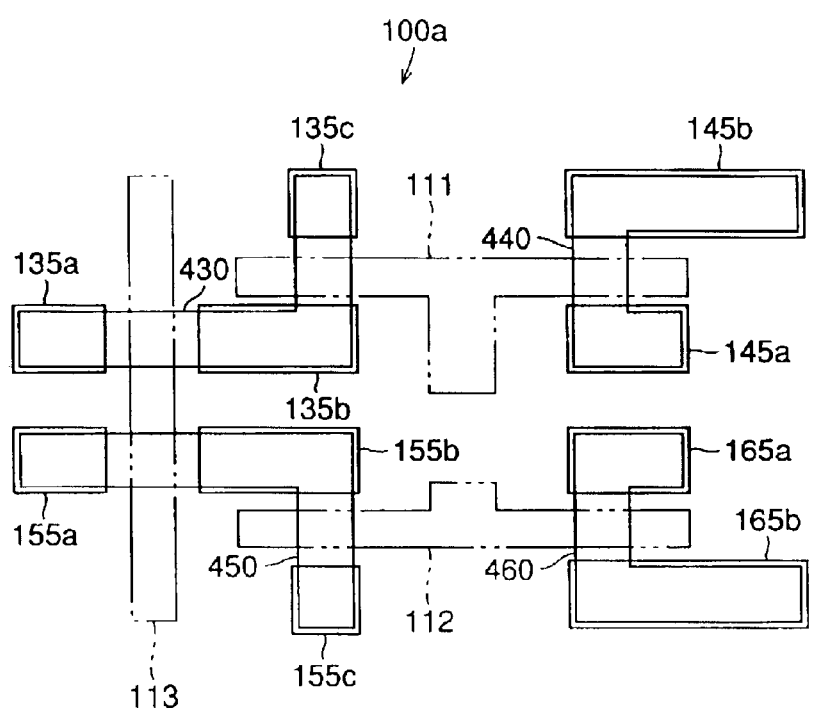
FIG. 2 is a plan view of all active region of the SRAM shown in FIG. 1.

Referring to FIG. 2, active region 430 has p-type impurity regions 135a to 135c. Note that although p-type impurity regions 135a to 135c are shown in FIG. 2 being greater than active region 430 in width, they are actually formed in active region 430. Active regions 135a to 135c are formed in those portions of active region 430 where gate electrodes 111 and 113 are not formed.

Active region 440 has n-type impurity regions 145a and 145b. Although impurity regions 145a and 145b are shown being greater than active region 440 in width, they are actually formed in active region 440. Impurity regions 145a and 145b are formed in those portions of active region 440 where gate electrode 111 is not formed.

Active region 450 has p-type impurity regions 155a to 155c. Although impurity regions 155a to 155c are shown being greater than active region 450 in width, they are actually formed in active region 450. Impurity regions 155a to 155c are formed in those portions of active region 450 where gate electrodes 112 and 113 are not formed.

Active region 460 has n-type impurity regions 165a and 165b. Although impurity regions 165a and 165b are shown being greater than active region 460 in width, they are actually formed in active region 460. Impurity regions 165a and 165b are formed in those regions of active region 460 where gate electrode 112 is not formed.

Figure 3:
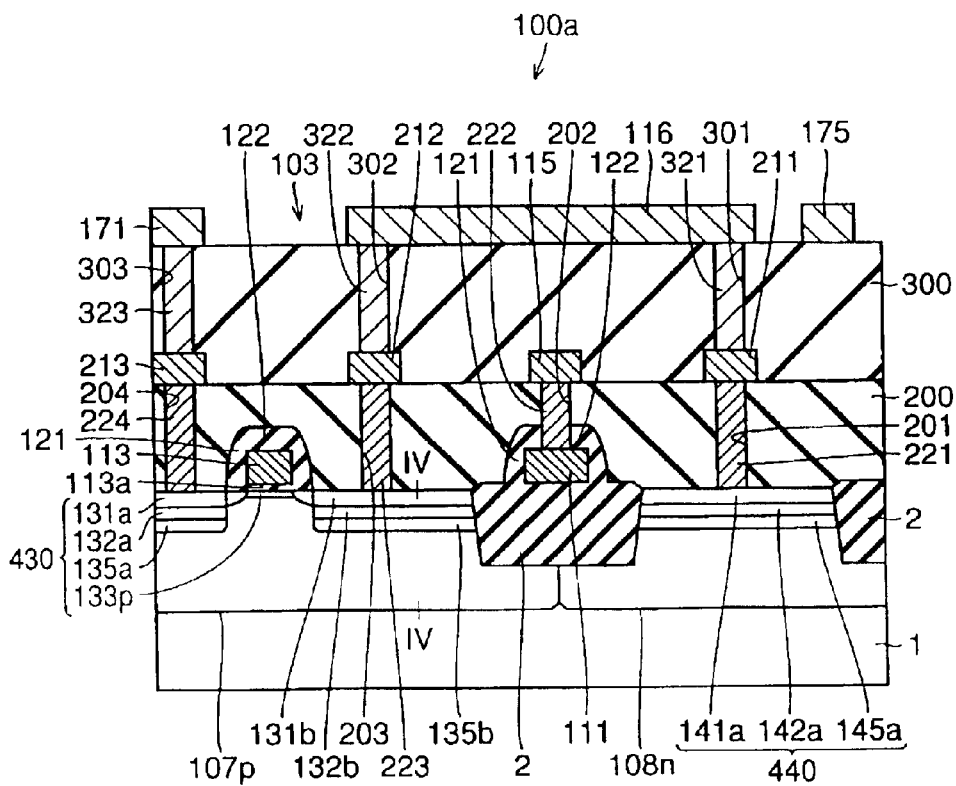
FIG. 3 is a cross sectional viewer taken along the line III—III in FIG. 1.

Referring to FIG. 3, memory cell 100a of the SRAM includes a silicon substrate 1 as a semiconductor substrate, storage node 116, n-type-low-concentration impurity region 131b and high-concentration impurity region 132b of the impurity region of the second conductivity type; and p-type impurity region 135b of the impurity region of the first conductivity type. Silicon substrate 1 has p-type well region 107p as the semiconductor region of the first conductivity type. Storage node 116 is formed above silicon substrate 1. N-type-low-concentration impurity region 131b and high-concentration impurity region 132b are formed in p-type well region 107p and electrically connected to storage node 116. P-type impurity region 135b is formed in p-type well region 107p in contact with n type high-concentration impurity region 132b.

Memory cell 100a of the SRAM has access transistor 103 as a field effect transistor. Access transistor 103 includes gate electrode 113, as well as low-concentration impurity regions 131a and 131b and high-concentration impurity regions 132a and 132b as source and drain regions. Gate electrode 113 is formed on silicon substrate 1 with gate insulative film 113a interposed. Low-concentration impurity regions 131a and 131b and high-concentration impurity regions 132a and 132b are formed in p-type well region 107p on both sides of gate electrode 113 and includes a pair of n-type impurity regions. Low-concentration impurity region 131b and high-concentration impurity region 132b are electrically connected to storage node 116. Memory cell 100a further includes p-type impurity regions 135a and 135b as a pair of impurity regions of the first conductivity type positioned under low-concentration impurity regions 131a, 131b and high-concentration impurity regions 132a, 132b. In the region under low-concentration impurity regions 131a, 131b and high-concentration impurity regions 132a, 132b, the impurity concentration of impurity regions 135a and 135b is higher than that of the region between the pair of impurity regions 135a and 135b.

Figure 4:
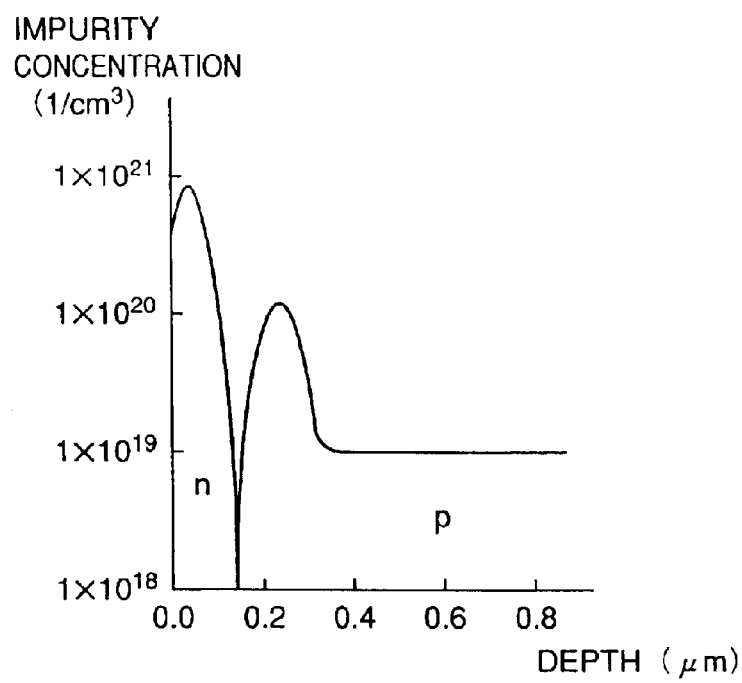
FIG. 4 is a graph showing a relationship between a depth of silicon substrate 1 and an impurity concentration along the line IV—IV in FIG. 3.

Referring to FIG. 4, in the SRAM of the present invention, the n-type impurity concentration is high near the surface of silicon substrate 1, and it decreases with increase in depth. Although the p-type impurity concentration is low at the surface of silicon substrate 1, it increases at the portion deeper than that where the n-type impurity concentration is low. Then, the p-type impurity concentration hits its peak at the depth exceeding 0.2 µm. After the peak, the p-type impurity concentration remains almost unchanged. Note that a boundary portion between the regions with n and p type impurities diffused is a depletion layer.

Figure 5:
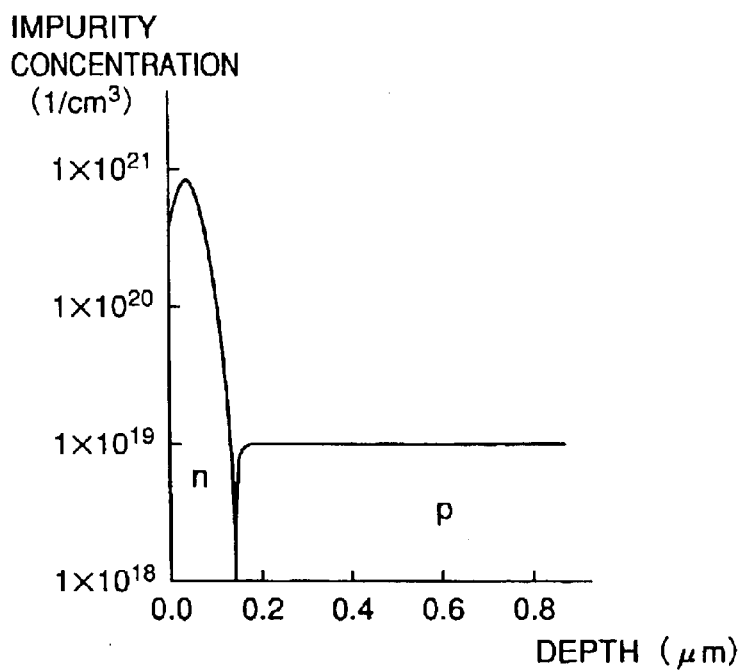
FIG. 5 is a graph showing a relationship between a depth of a silicon substrate and an impurity concentration over the same range along the line IV—IV in FIG. 3 in a conventional device.

Referring to FIG. 5, in the conventional SRAM, the n-type impurity concentration is high near the surface of the silicon substrate, and it decreases with increase in depth. The p-type impurity concentration does not have a peak at the region with a depth exceeding 0.2 µm, but remains substantially unchanged.

Figure 6:
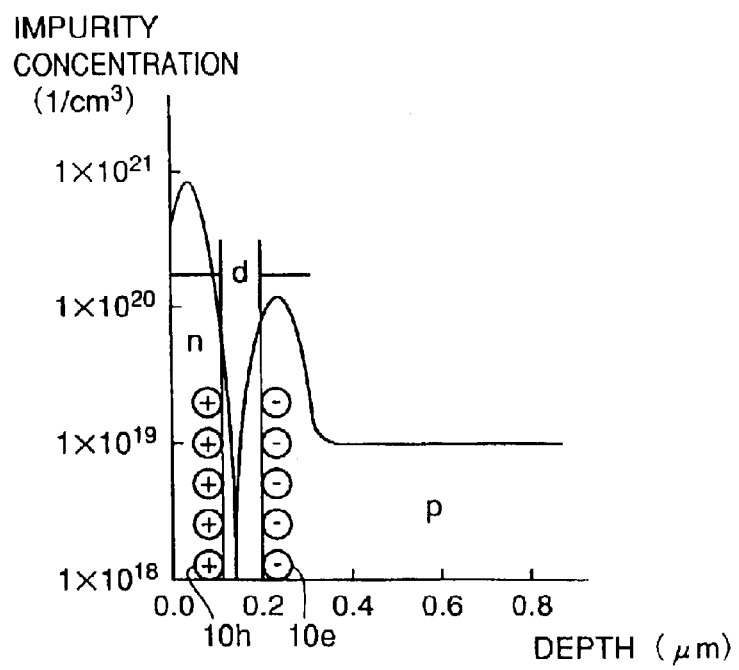
FIG. 6 is a graph shown in conjunction with a function of the SRAM according to the present invention.

Referring to FIG. 6, in the SRAM according to the present invention, the n-type impurity region of high-concentration impurity region 132b and the p-type impurity region of impurity region 135b are in contact with and opposite to each other in silicon substrate 1, thereby forming a capacitor. Namely, holes 10h are accumulated in the region with the n type impurities diffused, whereas electrons 10e are accumulated in the region with the p type impurities diffused. Holes 10h and electrons 10e mutually attract through the depletion layer. As a result, holes 10h in the n-type impurity region are unlikely to be affected by other electrons or holes. Thus, loss of the holes in low-concentration impurity region 131b, high-concentration impurity region 132b, and storage node 116 is avoided, so that soft errors can be prevented.

Figure 7:
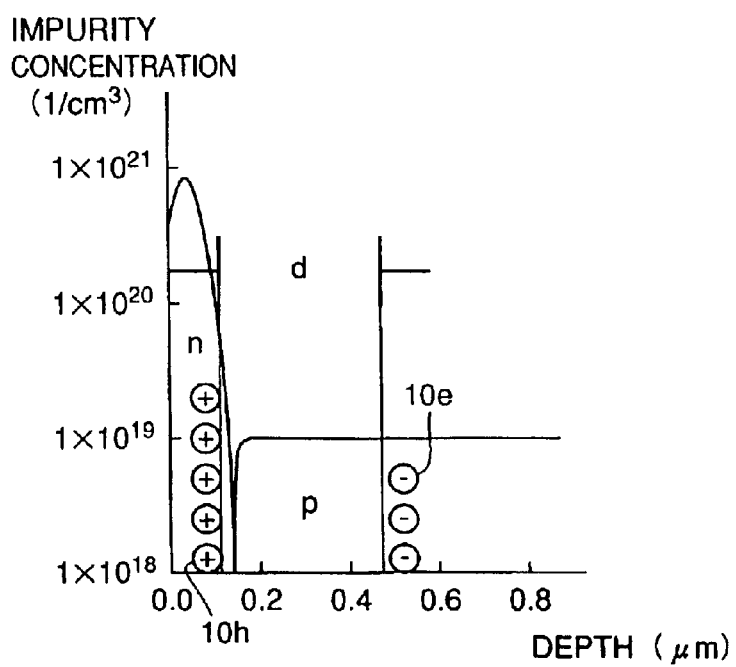
FIG. 7 is a graph shown in conjuction with a function of a conventional SRAM.

Referring to FIG. 7, in the conventional SRAM, the impurity concentration does not have a peak in the region with the p type impurities diffused. Thus, the p and n-type impurity regions form a capacitor with a longer distance between the electrodes. Holes and electrons are respectively accumulated in the n and p-type impurity regions also in such a capacitor. Although these regions are capacitively coupled, they have a small coupling capacitance. As a result, the holes in the n-type impurity region are likely to be affected by other holes or electrons, thereby causing data loss.

Figure 8:
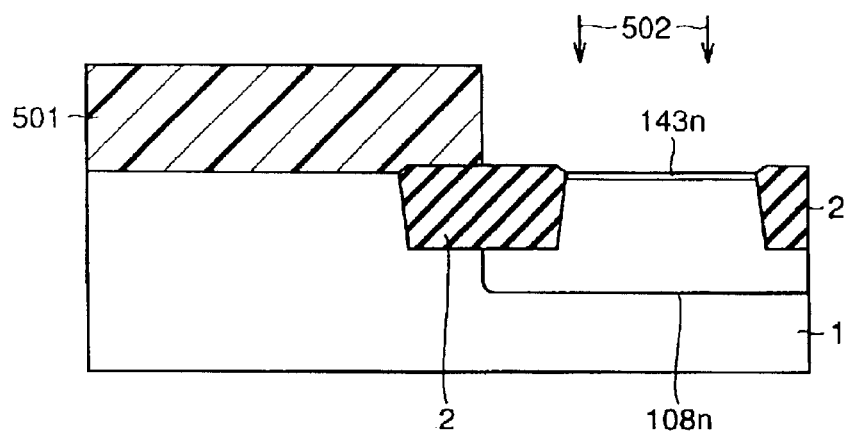
FIGS. 8 to 16 are cross sectional views shown in conjunction with the first to ninth steps of a method of manufacturing the SRAM shown in FIG. 3.

Now, a method of manufacturing the SRAM according to the present invention shown in FIG. 3 will be described with reference to the drawings. Referring to FIG. 8, an isolation oxide film 2 is formed in the surface of silicon substrate 1. A resist pattern 501 is formed to cover a prescribed portion of the surface of silicon substrate 1. Using resist pattern 501 as a mask, phosphorus ions are implanted at an implantation energy of 200 keV to 1.5 MeV with a dose of $1\times10^{13}$ cm$^{-2}$ in the direction indicated by arrows 502. This forms an n-type well region 108n. Then, arsenic or phosphorus ions are implanted into the surface of silicon substrate 1 at implantation energy of 200 keV or less with a dose of $1\times10^{12}$ cm$^{-2}$ as shown by arrows 502 using resist pattern 501 as a mask. This forms a channel dope region 143n.

Figure 9:
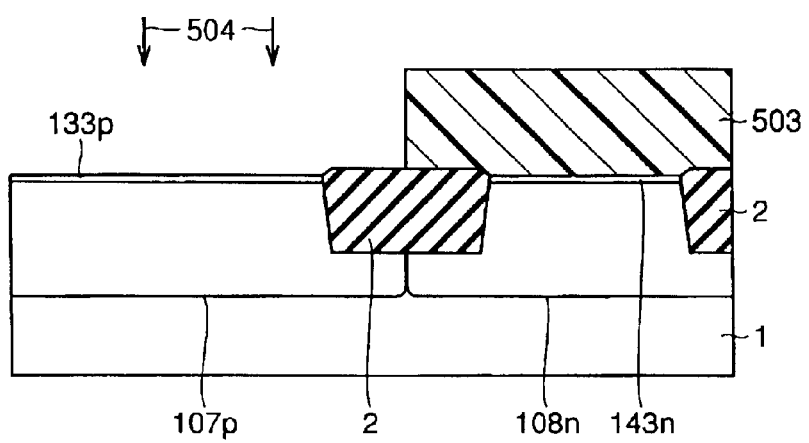

Referring to FIG. 9, a resist pattern 503 is formed on the surface of silicon substrate 1 for exposing a prescribed region. Using resist pattern 503 as a mask, boron ions are implanted at 200 keV to 1 MeV with a dose of $1\times10^{13}$ cm$^{-2}$ into the surface of silicon substrate 1 as shown by arrows 504. This forms a p-type well region 107p. Using resist pattern 503 as a mask, boron ions are implanted into the surface of silicon substrate 1 at 200 keV or less with a dose of $1\times10^{12}$ cm$^{-2}$ as shown by arrows 504. This forms a channel dope region 133p.

Figure 10:
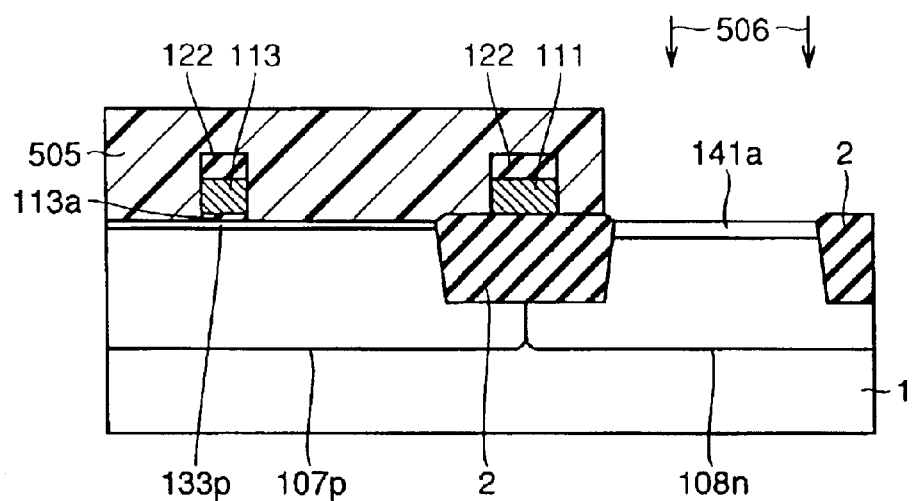

Referring to FIG. 10, a silicon oxide film, a polysilicon film, and a silicon oxide film are formed on the surface of silicon substrate 1 in layers. A resist pattern having a gate electrode pattern is formed thereon. Using the resist pattern as a mask, the silicon oxide film, polysilicon film, and silicon oxide film are etched. This forms a gate insulative film 113a, a gate electrode 113, and an upper oxide film 122. Further, a gate electrode 111 and upper oxide film 122 are formed on isolation oxide film 2. A resist pattern 505 is formed on the surface of silicon substrate 1. Using resist pattern 505 as a mask, boron ions are implanted into the surface of silicon substrate 1 at 10 keV or less with a dose of $1\times10^{13}$ cm$^{-2}$. This forms a low-concentration impurity region 141a on the surface of n-type well region 108n.

Figure 11:
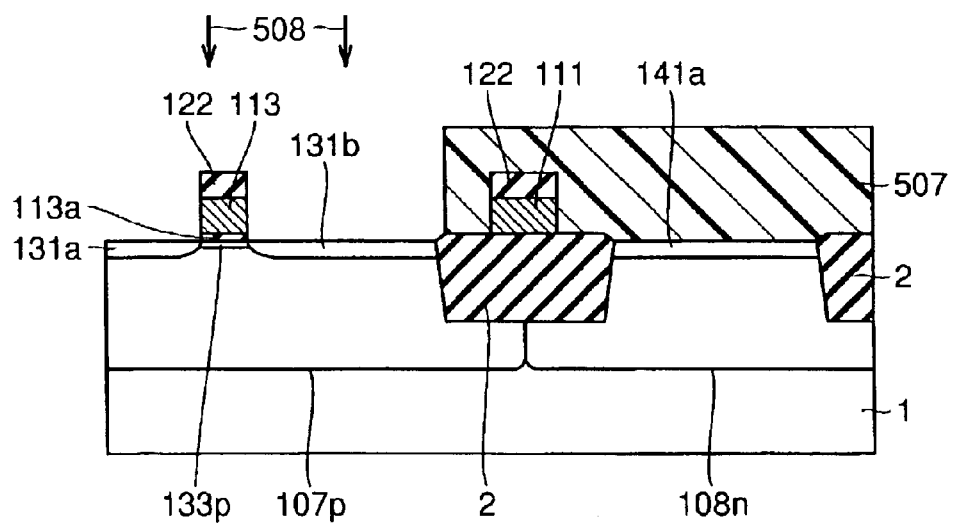

Referring to FIG. 11, a resist pattern 507 is formed on the surface of silicon substrate 1. Using resist pattern 507 and gate electrode 113 as masks, phosphorus or arsenic ions are implanted into the surface of silicon substrate 1 at 30 keV or less with a dose of $1 \times 10^{13}$ cm$^{-2}$ as shown by arrows 508. This forms low-concentration impurity regions 131a and 131b on both sides of gate electrode 113.

Figure 12:
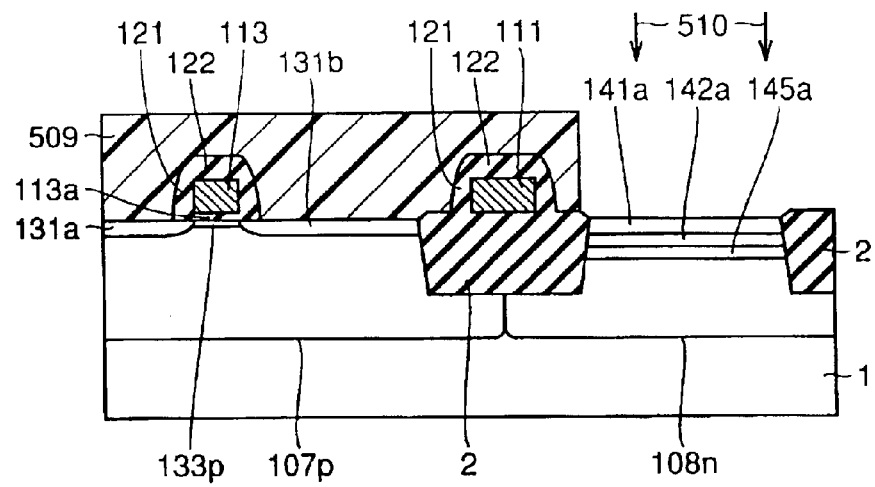

Referring to FIG. 12, a silicon oxide film is formed to cover the surface of silicon substrate 1. The entire surface of the silicon oxide film is etched back to form a sidewall oxide film 121 on the sidewalls of gate electrodes 113 and 111. A resist pattern 509 is formed on the surface of silicon substrate 1. Using resist pattern 509 as a mask, BF$_2$ ions are implanted into the surface of silicon substrate 1 at 10 keV or less with a dose of $5 \times 10^{15}$ cm$^{-2}$ as shown by arrows 510. This forms a low-concentration impurity region 142a. Using resist pattern 509 as a mask, arsenic ions are implanted into silicon substrate 1 at 200 keV with a dose of $5 \times 10^{15}$ cm$^{-2}$ as shown by arrows 510. This forms an impurity region 145a.

Figure 13:
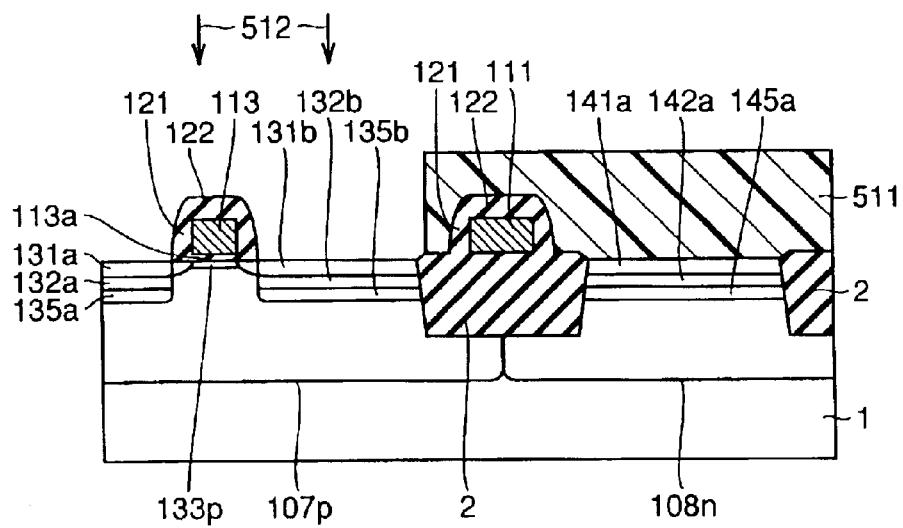

Referring to FIG. 13, a resist pattern 511 is formed on the surface of silicon substrate 1. Using resist pattern 511, gate electrode 113, and sidewall oxide film 121 as masks, arsenic ions are implanted at 40 keV or less with a dose of $5 \times 10^{15}$ cm$^{-2}$ as shown by arrows 512. This forms high-concentration impurity regions 132a and 132b. Using resist pattern 511 and sidewall oxide film 121 as masks, BF$_2$ ions are implanted at 200 keV with a dose of $5 \times 10^{15}$ cm$^{-2}$ as shown by arrows 512. This forms impurity regions 135a and 135b.

Figure 14:
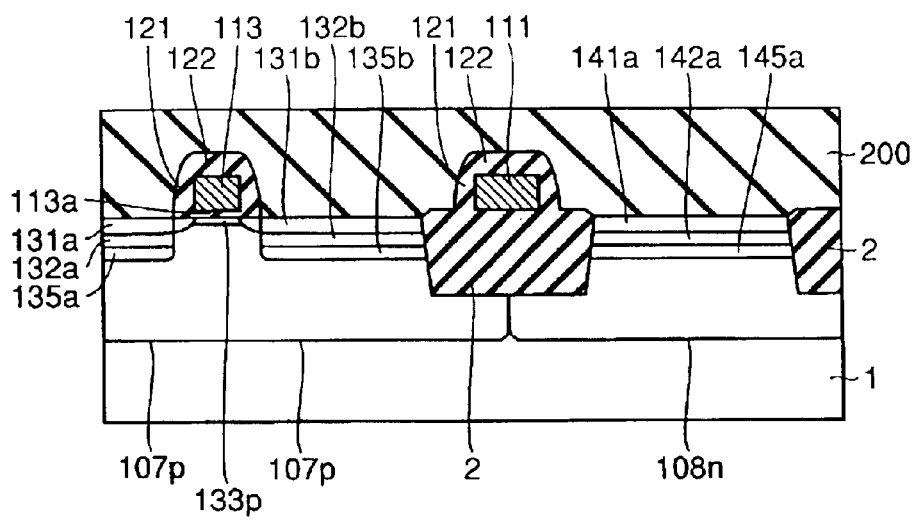

Referring to FIG. 14, an interlayer insulative film 200 of a silicon oxide film is formed to cover the entire surface of silicon substrate 1.

Figure 15:
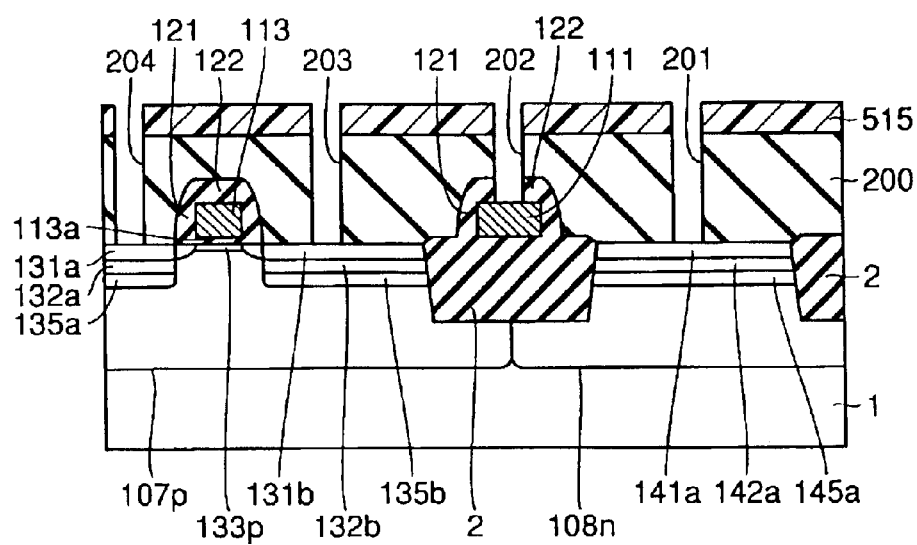

Referring to FIG. 15, a resist pattern 515 is formed on interlayer insulative film 200. Using resist pattern 515 as a mask, interlayer insulative film 200 is etched to form contact holes 201, 202, 203, and 204, respectively reaching low-concentration impurity region 141a, gate electrode 111, and low-concentration impurity regions 131b and 131a.

Figure 16:
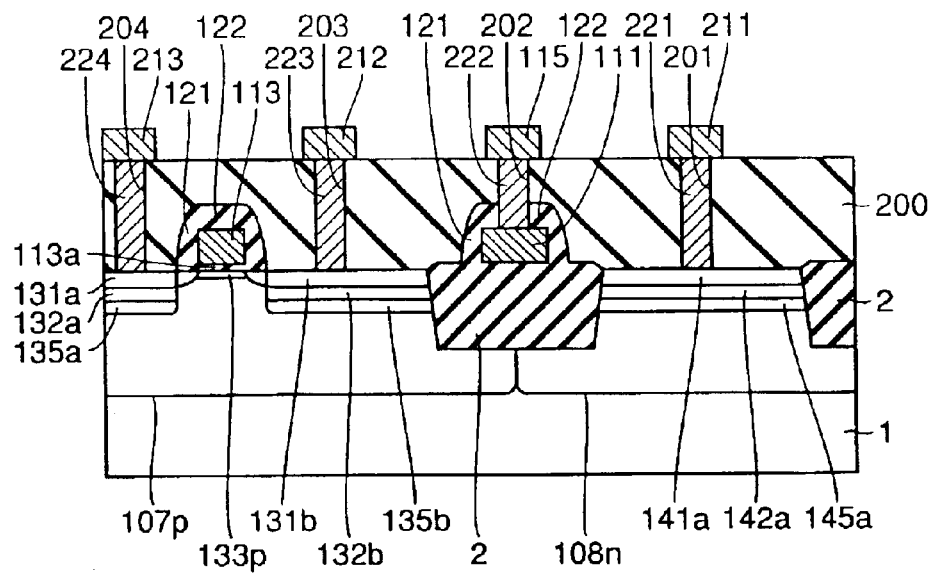

Referring to FIG. 16, a tungsten layer is formed to fill in contact holes 201 to 204. Etching back the entire surface of the tungsten layer forms plug layers 221 to 224 filled in contact holes 201 to 204. A polysilicon layer is formed on interlayer insulative film 200. A prescribed resist pattern is formed on the polysilicon layer. Etching the polysilicon layer using the resist pattern as a mask forms pad electrodes 211, 212, and 213 in contact with plug layers 221, 223, and 224 as well as a storage node 115 in contact with plug layer 222.

Referring to FIG. 3, an interlayer insulative film 300 is formed to cover interlayer insulative film 200. A resist pattern in a prescribed shape is formed on interlayer insulative film 300. Etching interlayer insulative film 300 using the resist pattern as a mask forms contact holes 301, 302, and 303, respectively reaching pad electrodes 211, 212, and 213. A tungsten layer is formed to fill in contact holes 301, 302, and 303. Etching back the entire surface of the tungsten layer forms plug layers 321, 322, and 323 filling in contact holes 301, 302, and 303. An aluminum film is formed on interlayer insulative film 300. A resist pattern in a prescribed shape is formed on the aluminum film, which is etched in accordance with the resist pattern. This forms a bit line 171, storage node 116 and power supply node 175. This completes memory cell 100a of the SRAM shown in FIG. 3.

In the SRAM thus formed in accordance with the first embodiment of the present invention, low-concentration impurity regions 131a, 132b and high-concentration impurity regions 132a, 132b formed in the n-type impurity region as well as impurity regions 135a and 135b of the p-type impurity region positioned thereunder are capacitively coupled. Thus, electric charges accumulated in low-concentration impurity regions 131a, 131b and high-concentration impurity regions 132a, 132b are reliably constrained in this region. Thus, even if α rays are directed to cause holes and electrons, electric charges in low-concentration impurity regions 131a, 131b and high-concentration impurity regions 132a, 132b would not be affected by the holes and electrons. As a result, soft errors can be prevented.

Further, in the manufacturing method, impurity regions 135a and 135b can be formed by using the same mask as that for manufacturing high-concentration impurity regions 132a and 132b. Thus, an SRAM with excellent resistance to soft errors can be provided without increasing the number of masks used.

Although the impurity region for capacitive coupling is formed in the entire active region in the present embodiment, such impurity region for capacitive coupling may be formed only in the impurity region to be connected to the storage node.

Further, referring to the cross sectional view of FIG. 3, impurity regions 135a and 135b may be formed in the region apart from the channel region of access transistor 103 not to affect the threshold value of access transistor 103.

In addition, the p-type impurity concentration of the portion between impurity regions 135a and 135b is lower than that of impurity regions 135a and 135b. Thus, formation of impurity regions 135a and 135b exerts no influence on the threshold value of access transistor 103.

Each of gate electrodes 111, 112, and 113 may have a two-layer structure of polysilicon and tungsten silicide or the like, rather than a single-layer structure of polysilicon, to have lower resistance. Further, a channel region may be formed in accordance with a so-called buried channel method.

The types of ions, implantation energy and dose employed for forming the impurity regions are illustrative only and not intended to limit the scope of the present invention.

Bit line 171, storage node 116, and power supply node 175 may be formed of copper, rather than aluminum, on interlayer insulative film 300.

When arsenic ions are implanted to form high-concentration impurity regions 132a and 132b and boron ions are implanted to form impurity regions 135a and 135b, boron implantation energy is preferably at least half and at most twice the arsenic implantation energy.

When BF$_2$ ions are implanted to form high-concentration impurity region 142a and phosphorus ions are implanted to form impurity region 145a, phosphorus implantation energy is preferably at least twice and at most ten times the BF$_2$ implantation energy. When boron ions are implanted to form high-concentration impurity region 142a and phosphorus ions are implanted to form impurity region 145a, phosphorus implantation energy is preferably ten times to fifty times the boron implantation energy.

Second Embodiment

Figure 17:
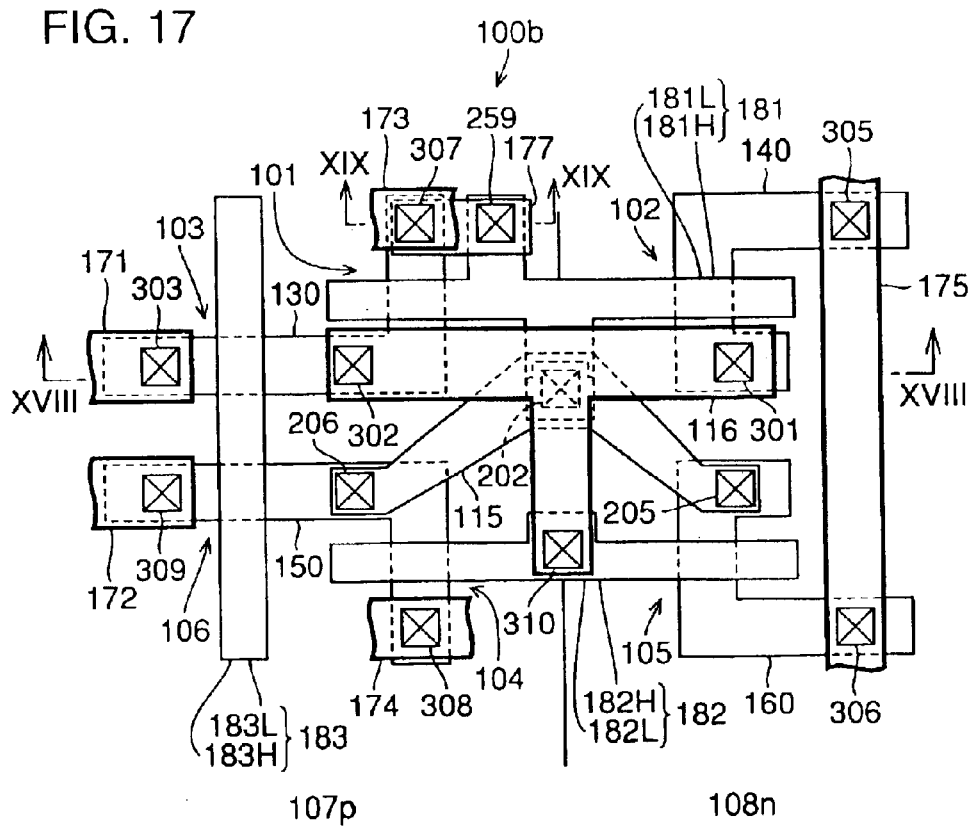
FIG. 17 is a plan view showing an SRAM according to a second embodiment of the present invention.

Referring to FIG. 17, a memory cell 100b of the SRAM according to the second embodiment of the present invention has gate electrodes 181, 182, and 183 which are different from the gate electrodes shown in FIG. 1 in structure. More specifically, gate electrode 181 has a lower electrode 181L and an upper electrode 181H, gate electrode 182 has a lower electrode 182L and an upper electrode 182H, and gate electrode 183 has a lower electrode 183L and an upper electrode 183H. Further, active regions 130, 140, 150, and 160 are different from the active regions shown in FIG. 1 in structure. Each of gate electrodes 181, 182, and 183 has a two-layer structure. Upper electrode 181H of gate electrode 181 is electrically connected to a ground node 173 through a contact hole 259 and a conductive layer 177.

Figure 18:
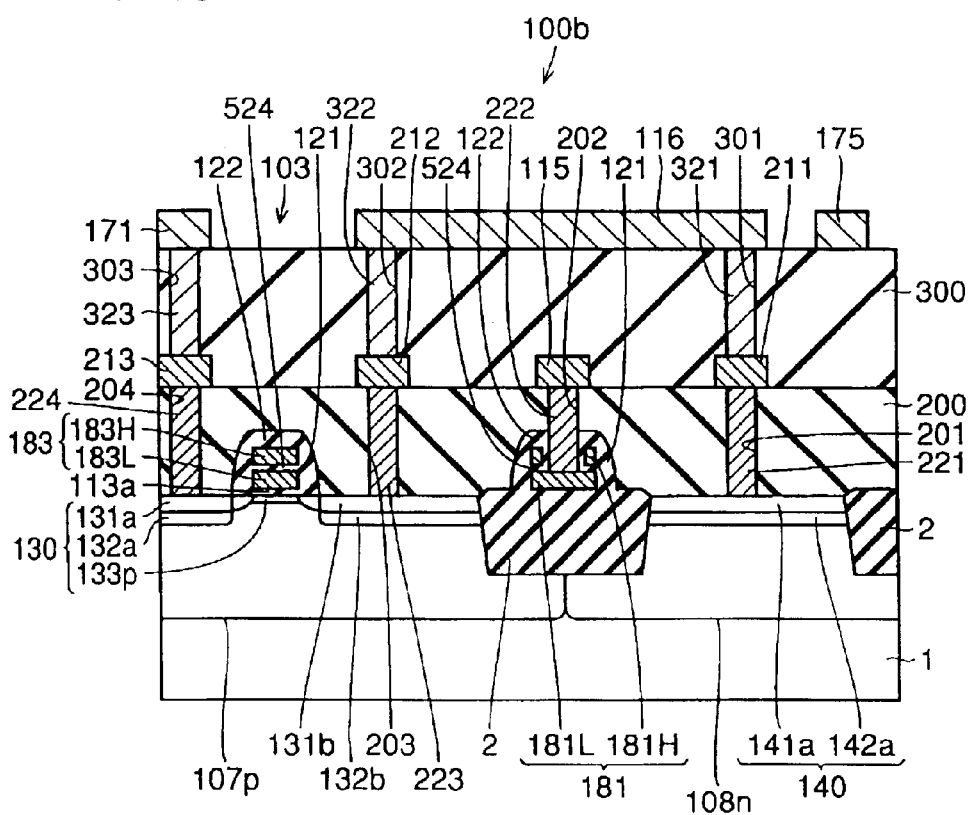
FIG. 18 is a cross sectional view taken along the line XVIII—XVIII in FIG. 17.

Referring to FIG. 18, memory cell 100b of the SRAM according to the second embodiment of the present invention is different from memory cell 100a of the SRAM according to the first embodiment shown in FIG. 3 in structure. More specifically, a gate electrode 181 of the SRAM has a two-layer structure including a lower electrode 181L and an upper electrode 181H formed of a silicon dielectric material on the lower electrode with a silicon oxide film 524 interposed. Gate electrode 183 also has a two-layer structure including a lower electrode 183L and an upper electrode 183H formed on lower electrode 183L with silicon oxide film 524 interposed. High-concentration impurity regions 132a, 132b, and 142a do not have an impurity region of an opposite conductivity type thereunder.

Memory cell 100b of the SRAM shown in FIG. 18 has a silicon substrate 1, and a gate electrode 181 as a storage node formed on silicon substrate 1. Gate electrode 181 has upper electrode 181H as a first storage node portion extending in a prescribed direction, and lower electrode 181L as a second storage node portion formed of a dielectric material opposite to and on upper electrode 181H with silicon oxide film 524 interposed and extending along upper electrode 181H. Upper electrode 181H is electrically connected to a ground node 173 of a region with substantially constant potential. Further, referring to FIG. 17, upper electrodes 181H, 182H, and 183H are formed substantially over the entire regions of lower electrodes 181L, 181H, and 183L when viewed from above. Upper electrode 181H may be electrically connected to a power supply node 175 with substantially constant potential. Upper electrode 182H may be electrically connected to a ground node 174. Upper electrode 182H may be electrically connected to power supply node 175. Gate electrode 181 is shared by drive transistor 101 and load transistor 102.

Figure 19:
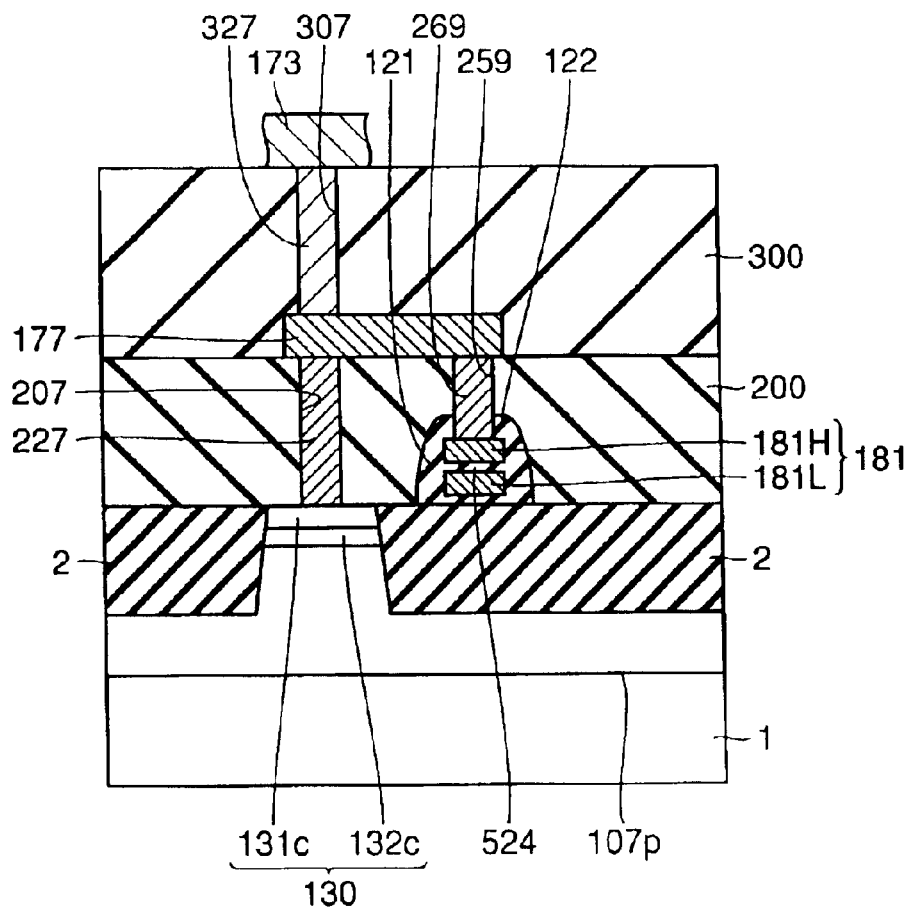
FIG. 19 is a cross sectional view taken along the line XIX—XIX in FIG. 17.

Referring to FIG. 19, silicon substrate 1 has a p-type well region 107p, and an isolation oxide film 2 formed in its surface. Low and high-concentration impurity regions 131c and 132c of active region 130 are formed between isolation oxide films 2. Gate electrode 181 is formed above isolation oxide film 2. Gate electrode 181 has a lower electrode 181L above isolation oxide film 2, and an upper electrode 181H formed on lower electrode 181L with a silicon oxide film 524 interposed. A sidewall oxide film 121 is formed on the sidewall of gate electrode 181, and an upper oxide film 122 is formed on gate electrode 181.

An interlayer insulative film 200 is formed to cover gate electrode 181. Interlayer insulative film 200 has a contact hole 207 reaching low-concentration impurity region 131c, and a contact hole 259. Plug layers 227 and 269 are formed to fill in contact holes 207 and 259. A conductive layer 177 is formed on interlayer insulative film 200 to be partially in contact with plug layers 227 and 269. An interlayer insulative film 300 is formed to cover interlayer insulative film 200. A contact hole 307 reaching conductive layer 177 is formed in interlayer insulative film 300. A plug layer 327 is formed to fill in contact hole 307, and a ground node 173 is formed on interlayer insulative film 300 to have contact with plug layer 327.

Figure 20:
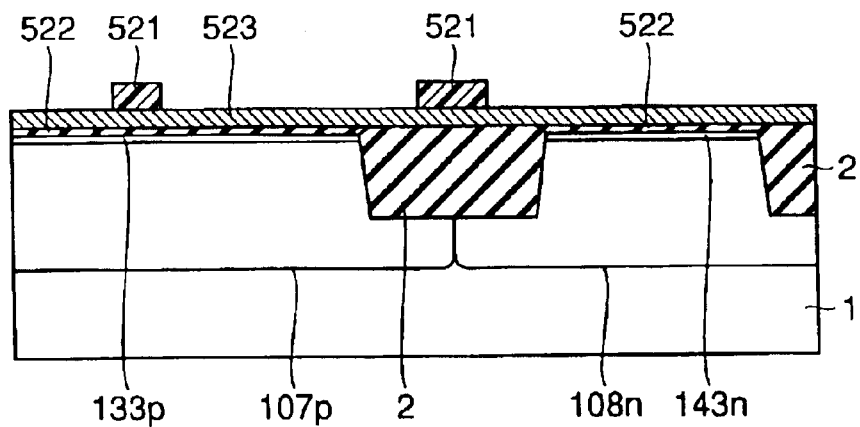
FIGS. 20 to 22 are cross sectional views showing the first to third steps of a method of manufacturing the SRAM shown in FIG. 18.

Now, a method of manufacturing the SRAM shown in FIGS. 18 and 19 will be described with reference to FIGS. 20 to 22. Referring to FIG. 20, as in the first embodiment, an isolation oxide film 2, an n-type well region 108n, a channel dope region 143n, a p-type well region 107p, and a channel dope region 133p are formed in silicon substrate 1. A silicon oxide film 522 is formed on silicon substrate 1. A polysilicon film 523 is formed on silicon oxide film 522. A resist pattern 521 in a prescribed shape is formed on polysilicon film 523.

Figure 21:
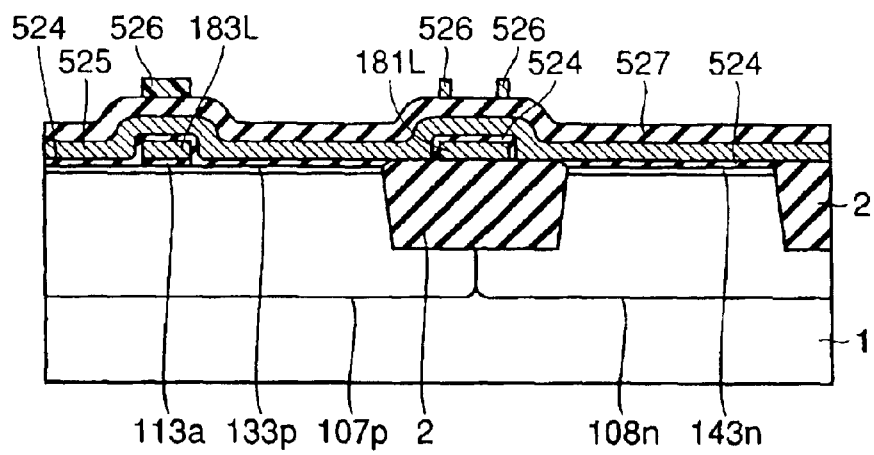

Referring to FIG. 21, the polysilicon film and silicon oxide film are etched using the resist pattern as a mask. This forms lower electrodes 181L and 183L as well as a gate insulative film 113a. Silicon oxide film 524 is formed on silicon substrate 1. A polysilicon film 525 is formed on silicon oxide film 524. A silicon oxide film 527 is formed on polysilicon film 525. A resist pattern 526 in a prescribed shape is formed on silicon oxide film 527.

Figure 22:
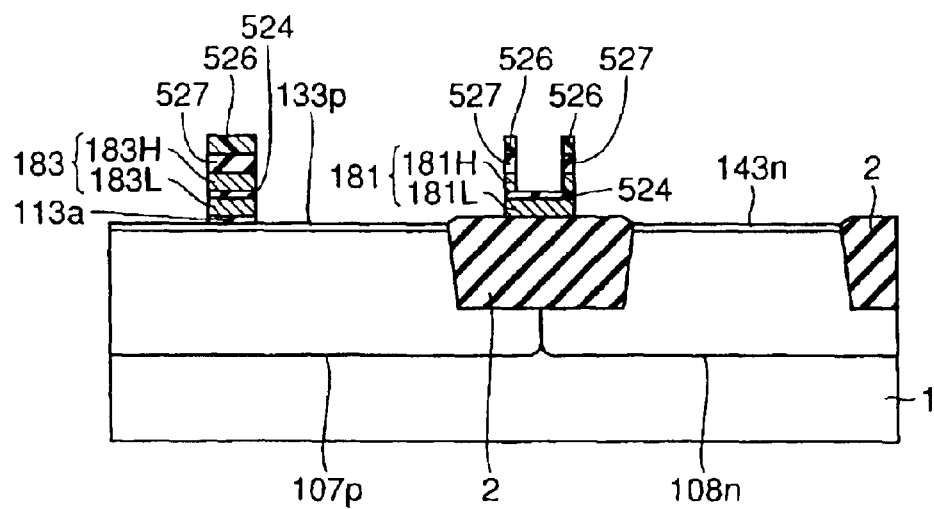

Referring to FIG. 22, silicon oxide film 527, polysilicon film 525, and silicon oxide film 524 are etched using resist pattern 526 as a mask. This forms gate electrodes 181 and 183 of upper electrodes 181H and 183H as well as lower electrodes 181L and 183L.

Referring to FIG. 18, a silicon oxide film is formed on the entire surface of the silicon substrate 1. Etching back the entire surface of the silicon oxide film forms a sidewall oxide film 121 on the sidewalls of gate electrodes 181 and 185. An interlayer insulative film 200 is formed to cover gate electrodes 181 and 183. A resist pattern in a prescribed shape is formed on interlayer insulative film 200. Etching interlayer insulative film 200 in accordance with the resist pattern forms contact holes 201, 202, 203, and 204 shown in FIG. 18 as well as contact holes 207 and 259 shown in FIG. 19. Plug layers 221, 222, 223, 224, 227, and 269 are formed to fill in contact holes 201 to 204, 207, and 259. A polysilicon film is formed on an interlayer insulative film 200. The polysilicon film is patterned in accordance with the prescribed resist pattern. This forms pad electrodes 211, 212, 213, storage node 115, and conductive layer 177. Thereafter, as in the first embodiment, interlayer insulative film 300, contact holes 301, 302, 303, and 307, plug layers 321, 322, 323, and 327, bit line 171, storage node 116, power supply node 175, and ground node 173 are formed.

In the SRAM having the above-described structure, lower electrode 181L connected to storage node 115 is arranged opposite to upper electrode 181H with a dielectric film interposed. Further, lower electrode 182L connected to storage node 116 is also arranged opposite to upper electrode 182H with a dielectric film interposed. Thus, the lower electrode opposite to the upper electrode is capacitively coupled to the upper electrode. As a result, electric charges accumulated in the lower electrode would not be affected by carriers caused by α rays or the like. Consequently, loss of electric charges accumulated in lower electrodes 181L, 182L and 183L is avoided to prevent soft errors.

Further, upper electrode 181H is electrically connected to ground node 173 with substantially constant potential. Thus, electric charges accumulated in lower electrode 181L are less likely to move.

Although an impurity region is not formed under high-concentration impurity regions 132a, 132b, and 142a in the second embodiment, an impurity region of a conductivity type opposite to that of these high-concentration impurity regions 132a, 132b, and 142a may be formed thereunder as in the first embodiment. This prevents soft errors more reliably.

Third Embodiment

Figure 23:
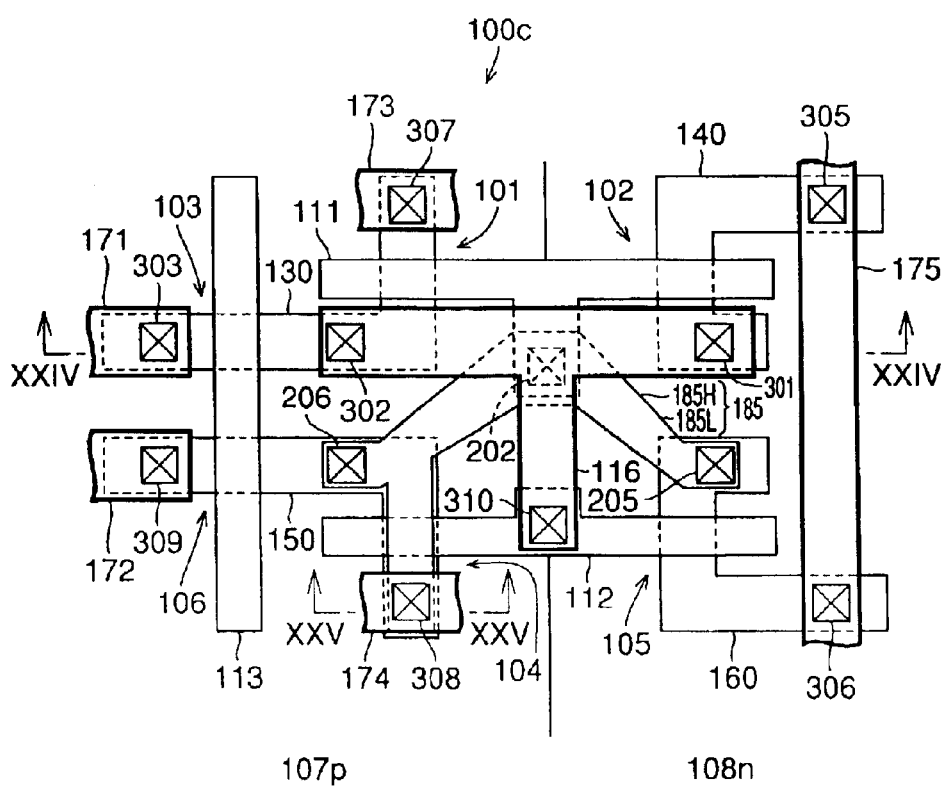
FIG. 23 is a plan view showing an SRAM according to a third embodiment of the present invention.

Referring to FIG. 23, a memory cell 100c of an SRAM according to the third embodiment of the present invention is different from memory cell 100b of the SRAM according to the second embodiment in that storage node 185 has a two-layer structure. Further, upper electrode 185H of storage node 185, including upper electrode 185H of and lower electrode 185L, is electrically connected to ground node 174 through contact hole 308. Note that upper electrode 185H may be electrically connected to power supply node 175.

Figure 24:
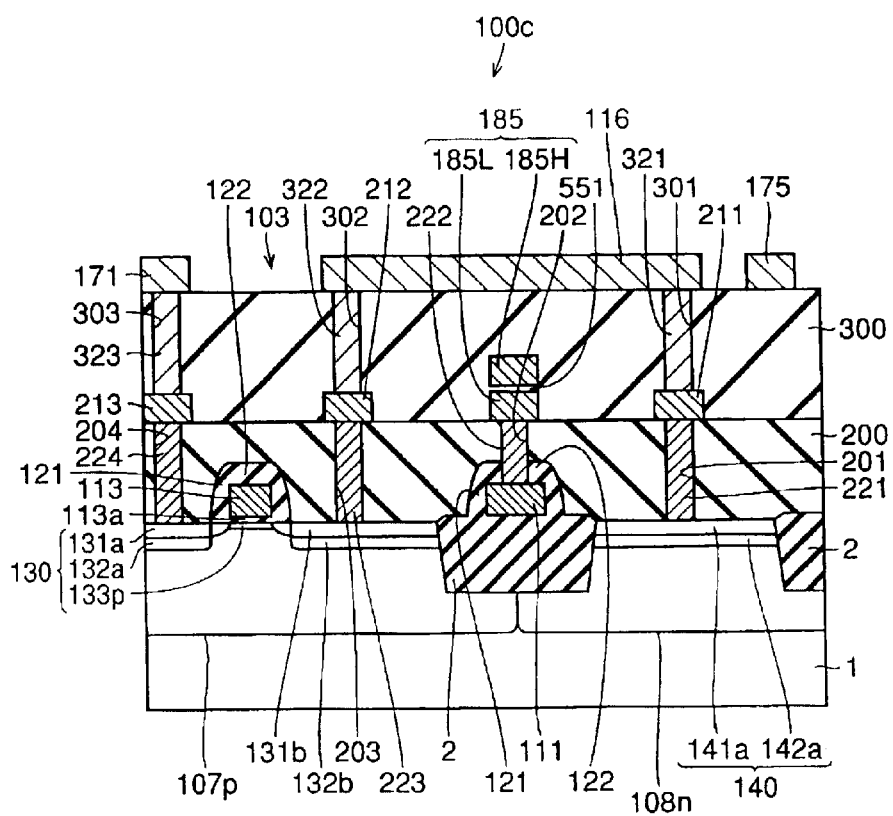
FIG. 24 is a cross sectional view taken along the line XXIV—XXIV in FIG. 23.

Referring to FIG. 24, memory cell 100c of the SRAM according to the third embodiment of the present invention includes a silicon substrate 1, and a storage node 185 formed on silicon substrate 1. Storage node 185 has an upper electrode 185H as a first storage node extending in a prescribed direction, and a lower electrode 185L as a second storage node formed opposite to and on upper electrode 185H with a silicon oxide film 551 of a dielectric material interposed, and extending in the same direction as upper electrode 185H. Upper electrode 185H is electrically connected to ground node 174 of a region with substantially constant potential. Storage node 185 electrically connects gate electrode 111 of one drive transistor 101 to the drain region of the other drive transistor 104.

Figure 25:
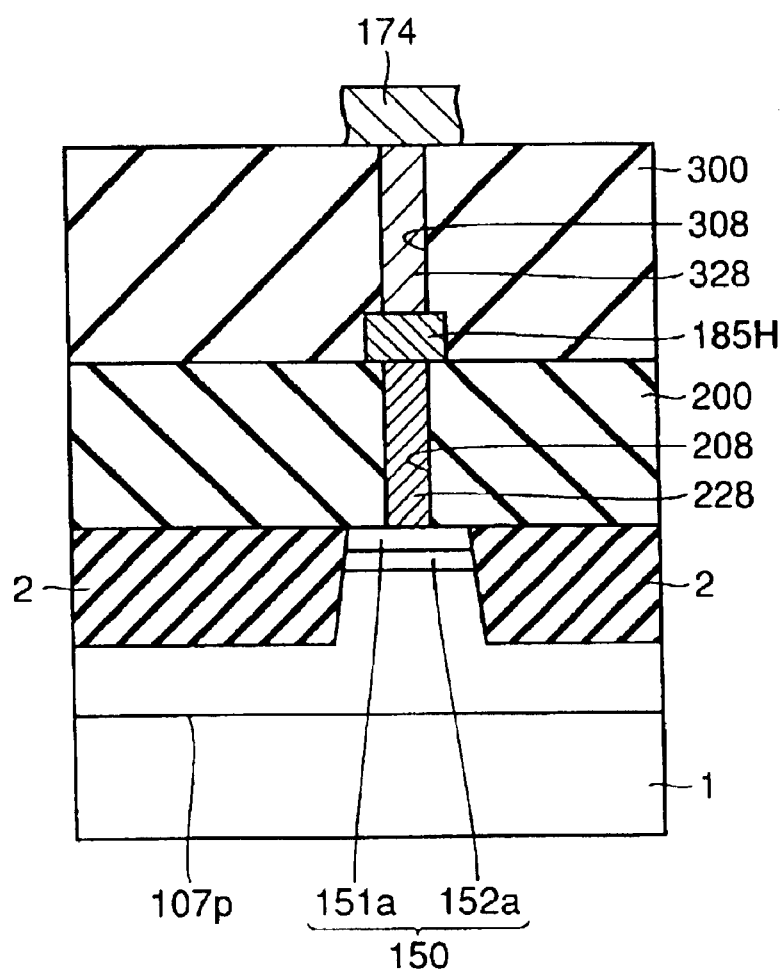
FIG. 25 is a cross sectional view taken along the line XXV—XXV in FIG. 23.

Referring to FIG. 25, a p-type well region 107p is formed on the surface of silicon substrate 1. An isolation oxide film 2 is formed in p-type well region 107p. An active region 150 having low and high-concentration impurity regions 151a and 152a is formed between adjacent isolation oxide films 2. An interlayer insulative film 200 is formed to cover the surface of silicon substrate 1. A contact hole 208 reaching the surface of low-concentration impurity region 151a is formed on interlayer insulative film 200. An upper electrode 185H is formed such that contact hole 208 reaches thereto. An interlayer insulative film 300 is formed to cover interlayer insulative film 200. A contact hole 308 is formed in interlayer insulative film 300, reaching upper electrode 185H. A plug layer 328 is filled in contact hole 308. A ground node 174 is formed to be in contact with plug layer 328.

Such a method manufacturing storage node 185 of lower electrode 185L and upper electrode 185H is similar to that of the gate electrode of the two-layer structure of the second embodiment. More specifically, in accordance with the method similar to that of the first embodiment, an n-type well region 108n, a p-type well region 107p, an isolation oxide film 2, active regions 130 and 140, an access transistor 103, an interlayer insulative film 200, contact holes 201 to 204, and plug layers 221 to 224 are formed in silicon substrate 1. A polysilicon film is formed on interlayer insulative film 200, and a resist pattern in a prescribed shape is formed thereon. Etching the polysilicon film in accordance with the resist pattern forms pad electrodes 211, 212, and 213 and also forms a lower electrode 185L. A silicon oxide film 551 is formed on lower electrode 185L, and a polysilicon film is formed thereon. A resist pattern in a prescribed shape is formed on the polysilicon film, which is in turn etched in accordance with the resist pattern This forms an upper electrode 185H. An interlayer insulative film 300 is formed to cover interlayer insulative film 200. A resist pattern in a prescribed shape is formed on interlayer insulative film 300. Etching interlayer insulative film 300 in accordance with the resist pattern forms contact holes 301, 302, and 303. Plug layers 321 to 323 are filled in contact holes 301 to 303. A bit line 171, storage node 116, and power supply node 175 are formed on interlayer insulative film 300 to complete a semiconductor device shown in FIG. 24.

Memory cell 100c of the SRAM having the above-described structure produces an effect similar to that of memory cell 100b of the second embodiment.

Fourth Embodiment

Figure 26:
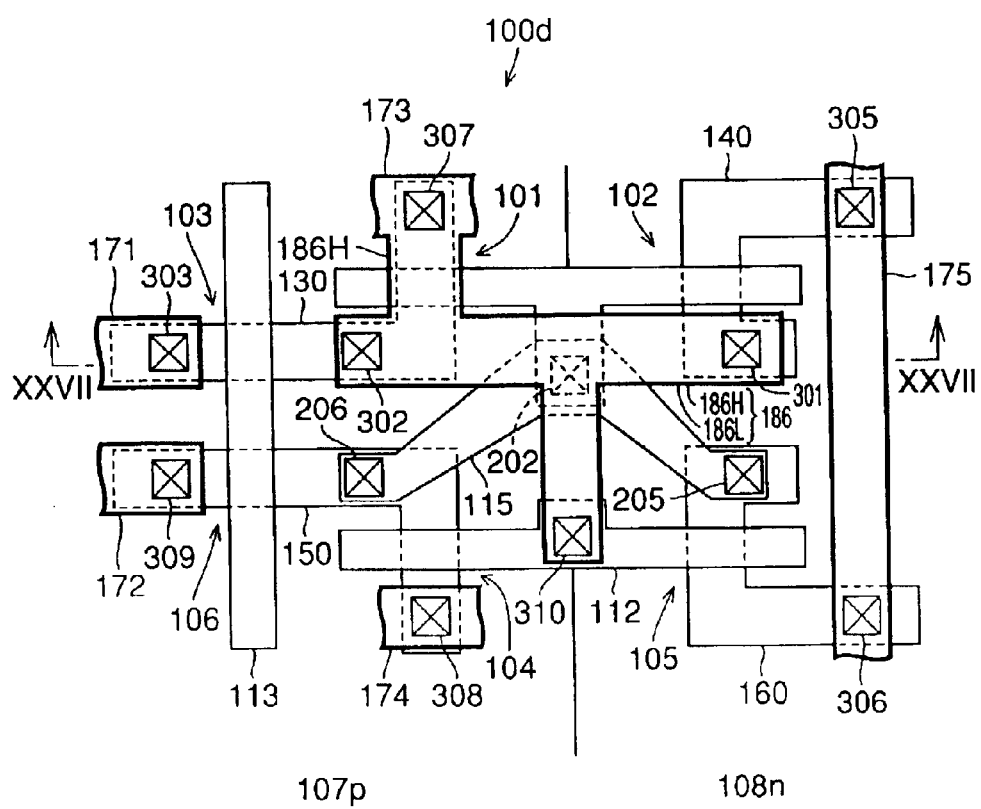
FIG. 26 is a plan view showing an SRAM according to a fourth embodiment of the present invention.

Memory cell 100d shown in FIG. 26 is different from memory cell 100c of the third embodiment in that storage node 186 has a two-layer structure With a lower electrode 186L and an upper electrode 186H formed on lower electrode 186L with a silicon oxide film interposed. Upper electrode 186H is connected to ground node 173 in the same plane. In other words, ground node 173 extends to be connected to upper electrode 186H. Upper electrode 186H is connected to active region 130 through contact hole 307. Lower electrode 186L does not exist where contact hole 307 is formed.

Figure 27:
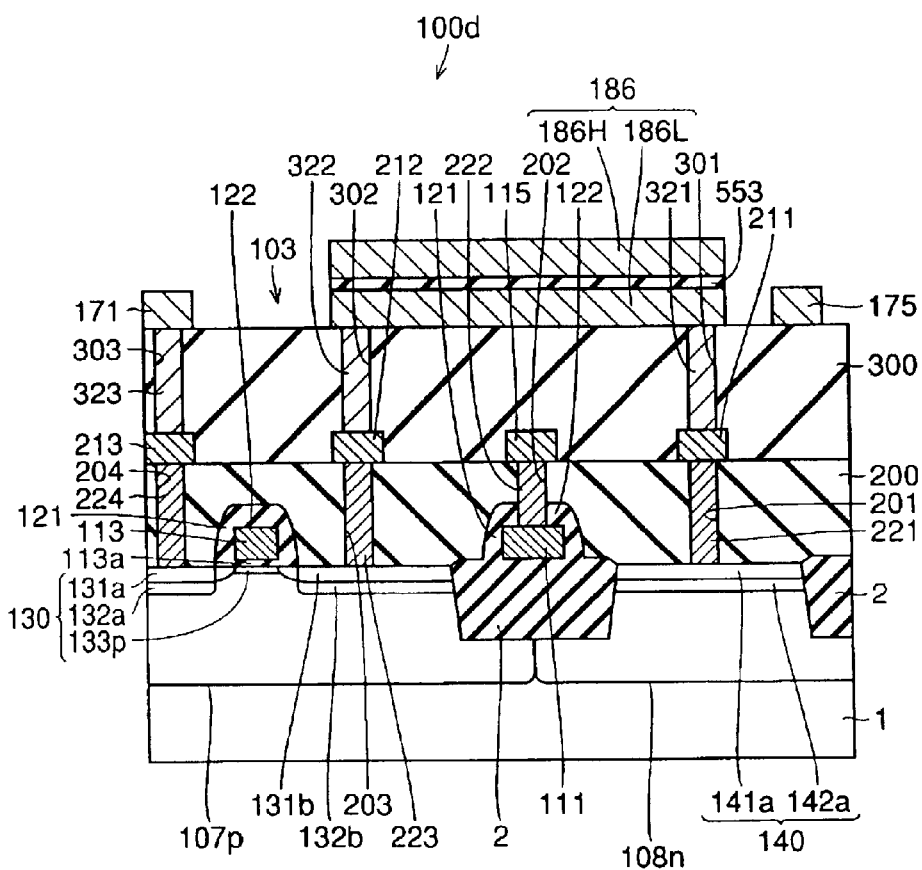
FIG. 27 is a cross sectional view taken along the line XXVII—XXVII in FIG. 26.

Referring to FIG. 27, memory cell 100d of the SRAM according to the fourth embodiment of the present invention is different from memory cell 100c of the third embodiment in that storage node 186 has a lower electrode 186L and an upper electrode 186H formed on lower electrode 186L with a silicon oxide film 553 of a dielectric material interposed. Memory cell 100d has a silicon substrate 1 and a storage node 186 formed on silicon substrate 1. Storage node 186 has an upper electrode 186H as a first storage node portion extending in a prescribed direction, and a lower electrode 186L as a second storage node formed opposite to and on upper electrode 186H with silicon oxide film 553 of a dielectric material interposed along upper electrode 186H. Upper electrode 186H is electrically connected to ground node 173 of a region with substantially constant potential. Note that upper electrode 186H may be electrically connected to power supply node 175. Upper electrode 186H is formed substantially over the entire region of lower electrode 186L when viewed from above. Storage node 186 electrically connects gate electrode 112 of one drive transistor 104 to the drain region of the other drive transistor 101.

Now, a method of manufacturing the memory cell of the SRAM shown in FIG. 27 will be described. Formed on silicon substrate 1 are isolation oxide film 2, n-type well region 108n, p-type well region 107p, access transistor 103, interlayer insulative film 200, plug layers 221 to 224, pad electrodes 211 to 213, storage node 115., interlayer insulative film 300, and plug layers 321 to 323. An aluminum film is formed on interlayer insulative film 300. A resist in a prescribed shape is formed on the aluminum film, which is etched in accordance with the resist pattern. This forms a bit line 171, a lower electrode 186l, and a power supply node 175. A silicon oxide film 553 is formed on lower electrode 186L. An aluminum film is formed on silicon oxide film 553. A resist pattern is formed on the aluminum film. Pattering aluminum film to have a prescribed shape in accordance with the resist pattern forms upper electrode 186H. This completes memory cell 100d of the SRAM shown in FIG. 27. Memory cell 100d of the SRAM having the above-described structure also produces an effect similar to that of memory cell 100c of the third embodiment.

Fifth Embodiment

Figure 28:
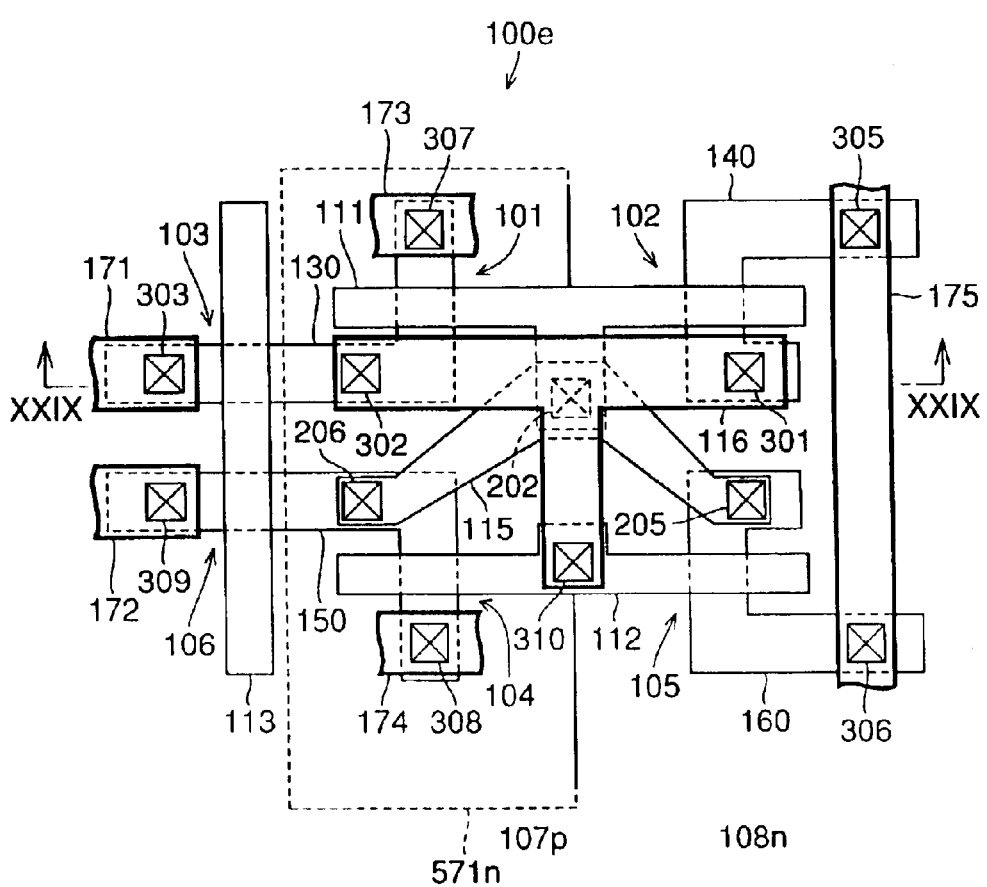
FIG. 28 is a plan view showing an SRAM according to a fifth embodiment of the present invention.

Referring to FIG. 28, a memory cell 10e of an SRAM according to the fifth embodiment of the present invention is different from memory cell 100a of the first embodiment in the structure of the well region. In other words memory cell 100e is different from memory cell 100a of the first embodiment in that it has an n-type well region 571n as an extension region formed in contact with n-type well region 108n. N-type well region 571n is formed under p-type well region 107p, extending near gate electrode 113. Namely, n-type well region 571n is formed to extend under p-type well region 107p. Further, active regions 130, 140, 150, and 160 differ from active regions 430, 440, 450, and 460 of the first embodiment in structure.

Figure 29:
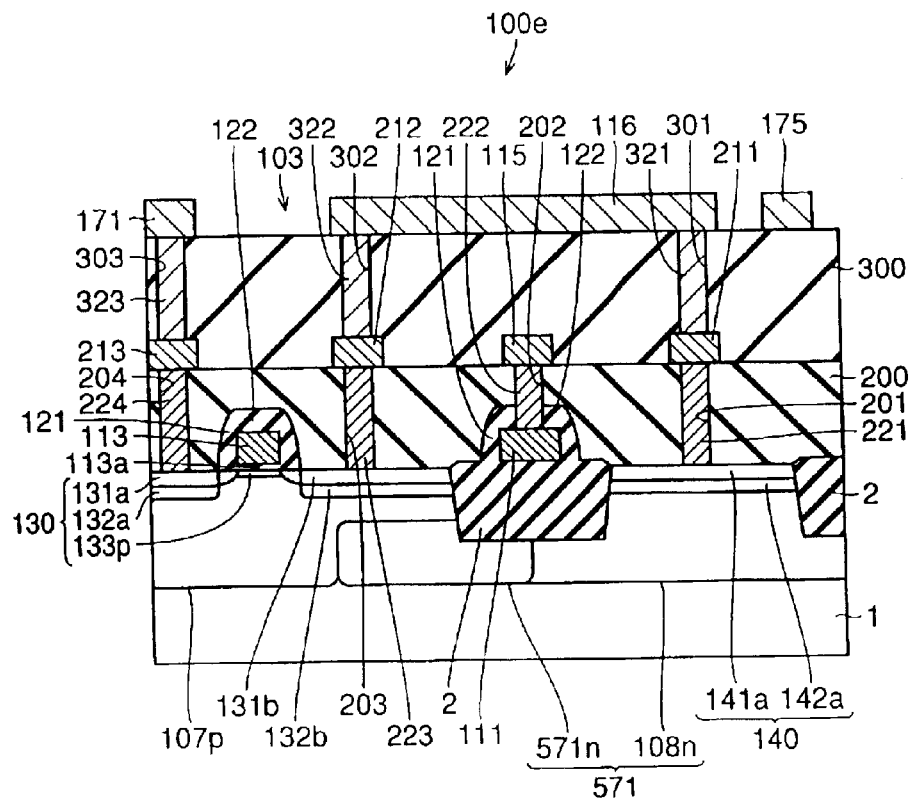
FIG. 29 is a cross sectional view taken along the line XXIX—XXIX in FIG. 28.

Referring to FIG. 29, in memory cell 100e of the SRAM according to the fifth embodiment of the present invention, an n-type well region 571n is formed between n and p-type well regions 108n and 107p, and two n-type well regions 108n and 571n form a semiconductor region 571. More specifically, memory cell 100e of the SRAM includes a silicon substrate 1 as a semiconductor substrate, a p-type well region 107p as a semiconductor region of the first conductivity type formed in silicon substrate 1, a semiconductor region 571 of as a semiconductor region of the second conductivity type, and an access transistor 103 as a field effect transistor. Semiconductor region 571 is formed in contact with p-type well region 107p. Access transistor 103 has a p type channel dope region 133p as a channel region of the first conductivity type formed in p-type well region 107p. Semiconductor region 571 has an n-type well region 571n formed in contact with p-type well region 107p as an first extension region extending toward channel dope region 133p. As shown in FIG. 28, semiconductor region 571 is electrically connected to power supply node 175 through contact holes 305 and 306. Thus, a potential different from that of p-type well region 107p is applied to semiconductor region 571 to attract electrons as carriers of the second conductivity type. N-type well region 571n is provided to avoid contact with high-concentration impurity region 132b. N-type well region 571n is formed to extend along high-concentration impurity region 132b.

Figure 30:
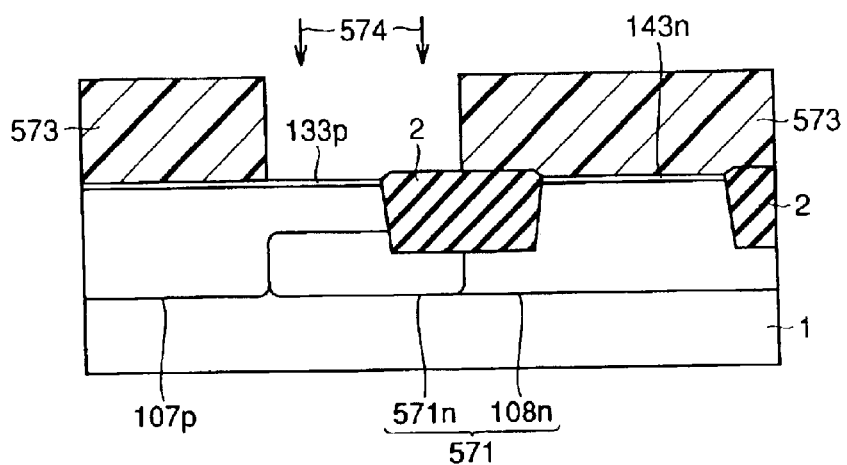
FIG. 30 is a cross sectional view shown in conjunction with a method of manufacturing the SRAM shown in FIG. 29.

Now, a method of manufacturing memory cell 100e shown in FIG. 29 will be described. Referring to FIG. 30, under the conditions as in the first embodiment, formed on the surface of silicon substrate 1 are an isolation oxide film, n-type well region 108n, channel dope region 143n, p-type well region 107p, and channel dope region 133p. A resist pattern 573 is formed on the surface of silicon substrate 1. Using resist pattern 573 as a mask, phosphorus ions are implanted into silicon substrate 1 at an implantation energy of 200 keV to 1.5 MeV with a dose of $1 \times 10_{13}$ cm-2, as shown by arrows 574. This forms an n-type well region 571n. Thereafter, the steps similar to those of the first embodiment (excluding the steps of forming impurity regions 135a, 135b, and 145a) are performed to complete memory cell 100e of the SRAM shown in FIG. 29.

In memory cell 100e having the above-described structure, n-type well region 571n extends toward access transistor 103, and the potential thereof is set to be higher than that of p-type well region 107p to attract electrons produced in the p-type well region. More specifically, p-type well region 107p has a ground potential, whereas n-type well region 571n has a power supply potential. Thus, any electrons and holes caused by αrays in p-type well region 107p can be attracted to n-type well region 571n. Accordingly, the electrons would not move to channel dope region 133p, so that malfunction of access transistor 103 is avoided. As a result, soft errors can be prevented.

Sixth Embodiment

Figure 31:
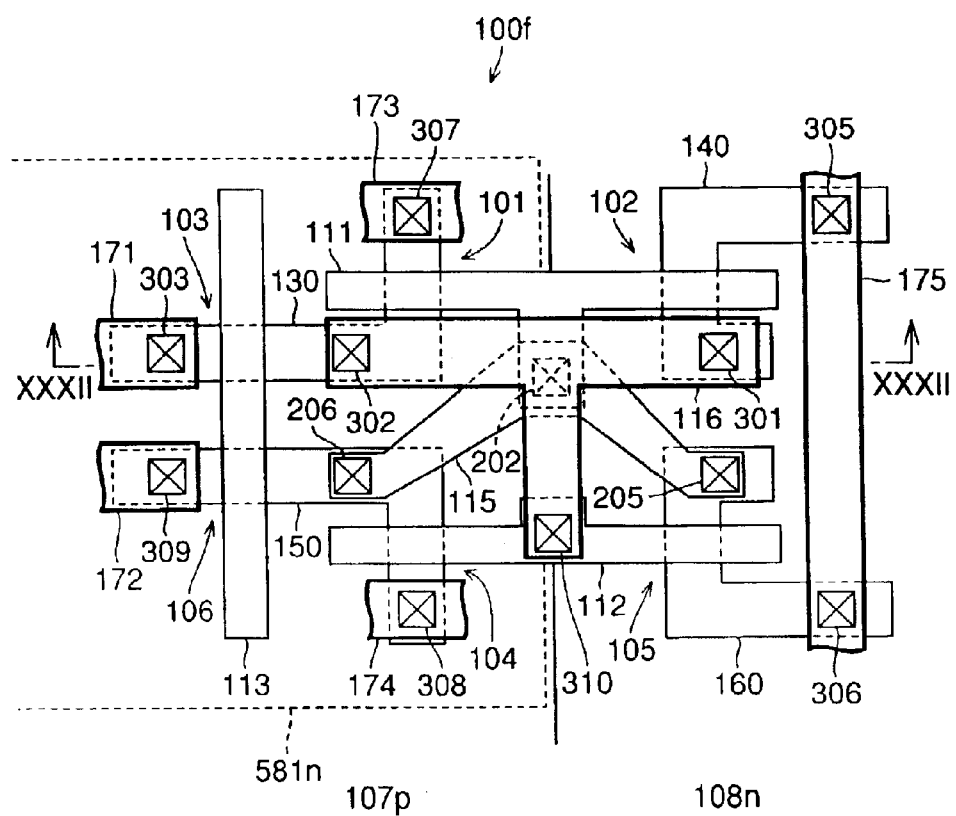
FIG. 31 is a plan view showing an SRAM according to a sixth embodiment of the present invention.

Referring to FIG. 31, a memory cell 100f of an SRAM according to the sixth embodiment of the present invention differs from memory cell 100e of the fifth embodiment in that it has an n-type well region 581n formed to cover the entire portion of p-type well region 107p from below. N-type well region 581n is connected to n-type well region 108n to cover the entire surface of p-type well region 107p. The n-type well region leads to the n-type well region (not shown) adjacent to the p-type well region.

Figure 32:
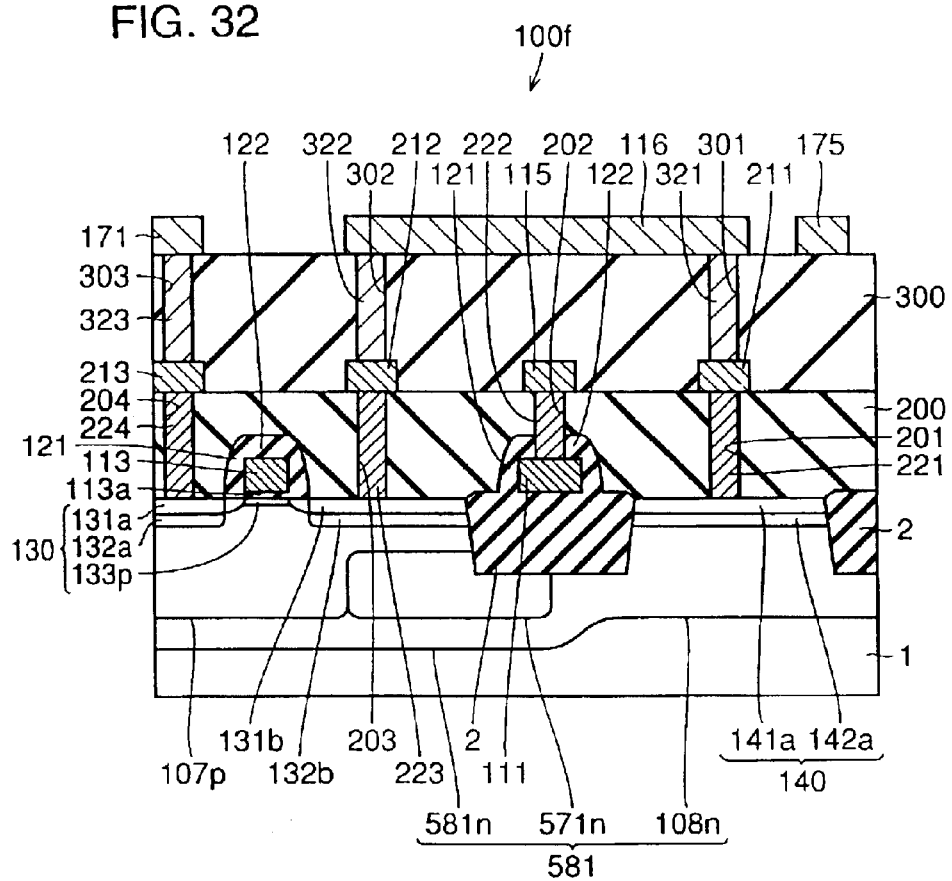
FIG. 32 is a cross sectional view taken along the line XXXII—XXXII in FIG. 31.
Figure 33:
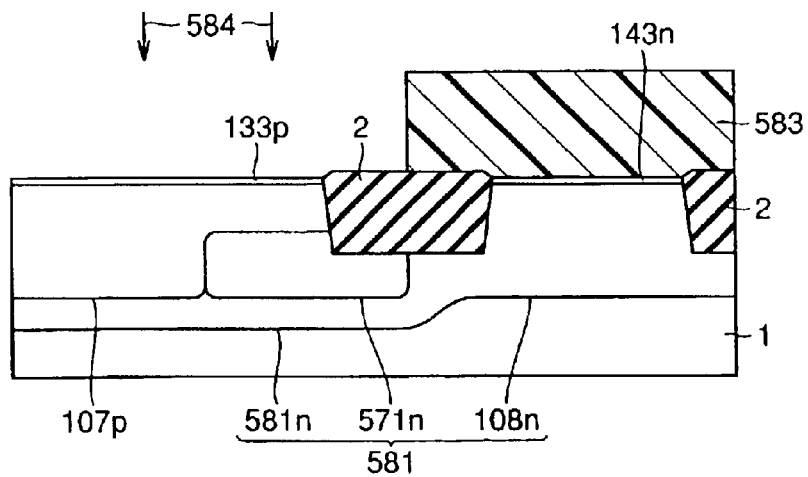
FIG. 33 is a cross sectional view shown in conjunction with a method of manufacturing the SRAM shown in FIG. 32.

Referring to FIG. 32, memory cell 100f of the SRAM according to the sixth embodiment of the present invention differs from memory cell 100e of the fifth embodiment in that it has n-type well region 581n under p-type well region 107p. Such well structure is known as a so called triple well structure. N-type well region 581n covers the bottom surface of p-type well region 107p. N-type well region 581n is in contact with n-type well regions 108n, 571n, and p-type well region 107p. N-type well region 581n is formed to extend under p-type well region 107p. Semiconductor region 581 as a semiconductor region of the second conductivity type includes n-type well region 581n as a second extension region covering p-type well region 107p as a semiconductor region of a first conductivity type.

Now, a method of manufacturing the memory cell shown in FIG. 32 will be described. In accordance with the steps similar to those of the fifth embodiment, formed on silicon substrate 1 are an n-type well region 108n, channel dope region 143n, p-type well region 107p, channel dope region 133p, and n-type well region 571n. A resist pattern 583 is formed on the surface of the silicon substrate 1. Phosphorus ions are implanted into silicon substrate 1 at an implantation energy of 1.5 to 3.0 MeV with a dose of $5 \times 10_{13}$ cm$^{-2}$ as shown by arrows 584 using resist pattern 581 as a mask. This forms an n-type well region 581n. Thereafter, in accordance with the step similar to those of the fifth embodiment, memory cell 100f of the SRAM is formed.

Memory cell 100f having the above-described structure produces an effect similar to that of memory cell 100e of the fifth embodiment.

N-type well region 58 in covers the entire surface of p-type well region 107p, so that soft errors can be effectively prevented.

Seventh Embodiment

Figure 34:
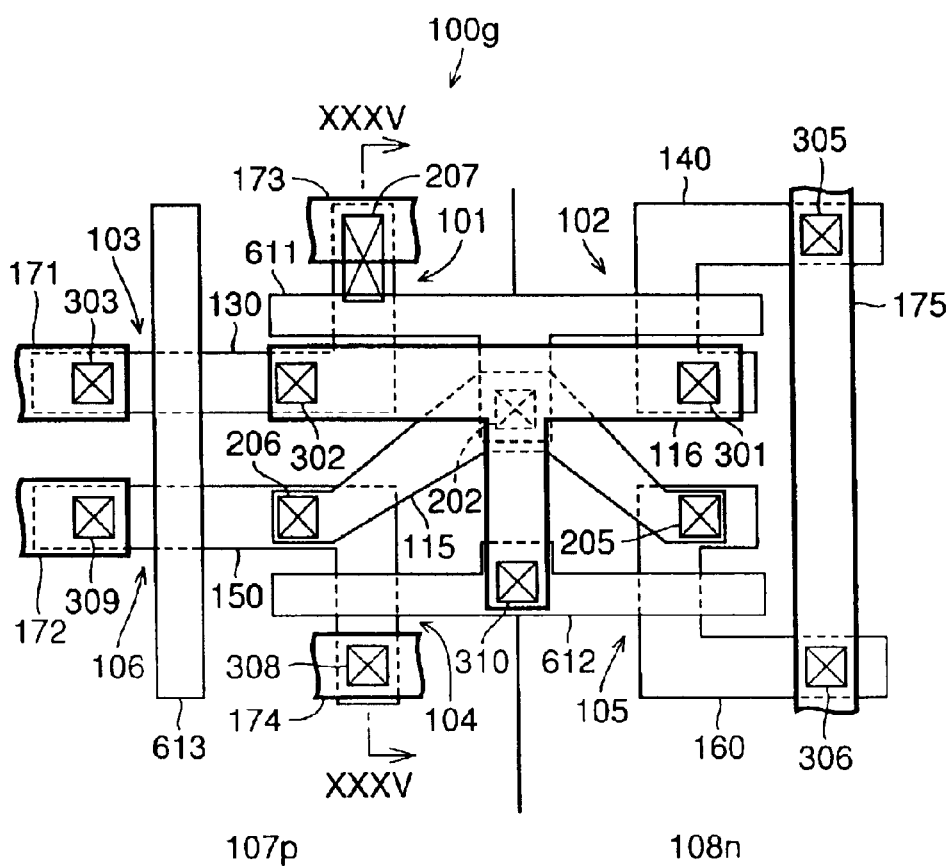
FIG. 34 is a plan view showing an SRAM according to a seventh embodiment of the present invention.

Referring to FIG. 34, a memory cell 100g of an SRAM according to the seventh embodiment of the present invention differs from memory cell 100a of the first embodiment in structures of gate electrodes 611, 612, and 613. Further, it differs from memory cell 100a of the first embodiment in that contact hole 207 is formed to cover gate electrode 611. In addition, another contact hole (not shown) is formed above contact hole 207. Moreover, structures of active regions 130, 140, 150, and 160 are different from those of active regions 430, 440, 450, and 460 of the first embodiment.

Figure 35:
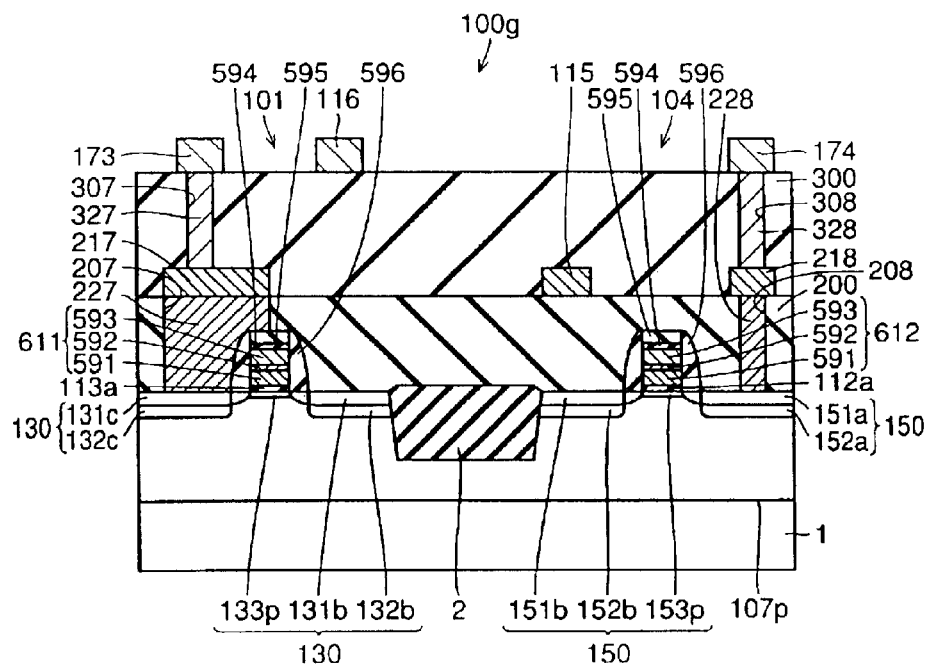
FIG. 35 is a cross sectional view taken along the line XXXV—XXXV in FIG. 34.

Referring to FIG. 35, p-type well region 107p is formed in silicon substrate 1. Isolation oxide film 2 is formed in p-type well region 107p. Drive transistors 101 and 104 are formed on both sides of isolation oxide film. Drive transistor 101 has low-concentration impurity regions 131b and 131c as well as high-concentration impurity regions 132b and 132c forming source and drain regions on both sides of gate electrode 611. Gate electrode 611 has a three-layer structure of a polysilicon layer 591, tungsten nitride layer 592, and tungsten silicide layer 593. A silicon oxide film 594 and a silicon nitride film 595 are formed on gate electrode 611. A sidewall nitride film 596 is formed on the sidewall of gate electrode 611. A channel dope region 133p is formed under gate electrode 611.

Drive transistor 104 has a gate electrode 612 formed on silicon substrate 1 with gate insulative film 112a interposed, and low-concentration impurity regions 151a, 151b and high-concentration impurity regions 152a, 152b as source and drain regions formed on both sides of gate electrodes 612. Gate electrode 612 has a three-layer structure of a polysilicon layer 591, tungsten nitride layer 592, and tungsten silicide layer 593. Formed on gate electrode 612 are a silicon oxide film 594 and a silicon nitride film 595. A sidewall nitride film 596 is formed on the sidewall of gate electrode 611. A channel dope region 153p is formed under gate electrode 612. An interlayer insulative film 200 is formed on the surface of silicon substrate 1. Contact holes 207 and 208 are formed in interlayer insulative film 200. Contact hole 207 partially includes gate electrode 611. Plug layers 227 and 228 are formed to fill in contact holes 207 and 208. Pad electrodes 217, 218 and storage node 115 are formed on interlayer insulative film 200. An interlayer insulative film 300 is formed on interlayer insulative film 200. Contact holes 307 and 308 are formed in interlayer insulative film 300. Plug layers 327 and 328 are formed to fill in contact holes 307 and 308. Ground nodes 173, 174 and storage node 116 are formed on interlayer insulative film 300.

More specifically, memory cell 100g has silicon substrate 1 as a semiconductor substrate, gate electrode 611, a sidewall nitride film 596 as a sidewall dielectric film, low-concentration impurity regions 131b, 131c and high-concentration impurity regions 132b, 132c as the source and drain regions, a plug layer 227 as a conductive layer. Gate electrode 611 is formed on silicon substrate 1 with gate insulative film 113a interposed and is electrically connected to storage node 115. Sidewall nitride film 596 is formed on the sidewall of gate electrode 611. Low-concentration impurity regions 131b, 131c and high-concentration impurity regions 132b, 132c are formed on silicon substrate 1 on both sides of gate electrode 611. Plug layer 221 is connected to low and high-concentration impurity regions 131c and 132c and is formed on gate electrode 611 with sidewall nitride film 596 interposed. Further, plug layer 227 is electrically connected to ground node 173 through plug layer 327 to have substantially constant potential.

Figure 36:
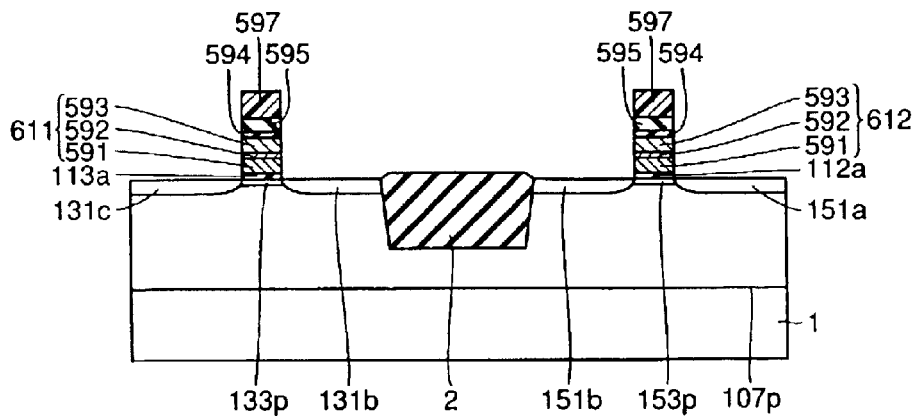
FIGS. 36 to 38 are cross sectional views showing the first to third steps of a method of manufacturing the SRAM shown in FIG. 35.

Now, a method of manufacturing memory cell 100g shown in FIG. 35 will be described. Referring to FIG. 36, in accordance with the steps similar to those of the first embodiment, an isolation oxide film 2 is formed on silicon substrate and then p-type well region 107p and channel dope region 133p, 153p are formed. Further, formed on silicon substrate 1 are a silicon oxide film, polysilicon film, tungsten nitride layer, tungsten silicide layer, silicon oxide film, and silicon nitride film. A resist pattern 597 is formed on the silicon nitride film. Etching the above mentioned films in accordance with resist pattern 597 forms a silicon nitride film 595, silicon oxide film 594, tungsten silicide layer 593, tungsten nitride layer 592, polysilicon layer 591, and gate insulative films 112a, 113a. Impurity ions are implanted to silicon substrate 1 under the conditions as in the first embodiment to form low-concentration impurity regions 131b, 131c, 151a, and 151b.

Figure 37:
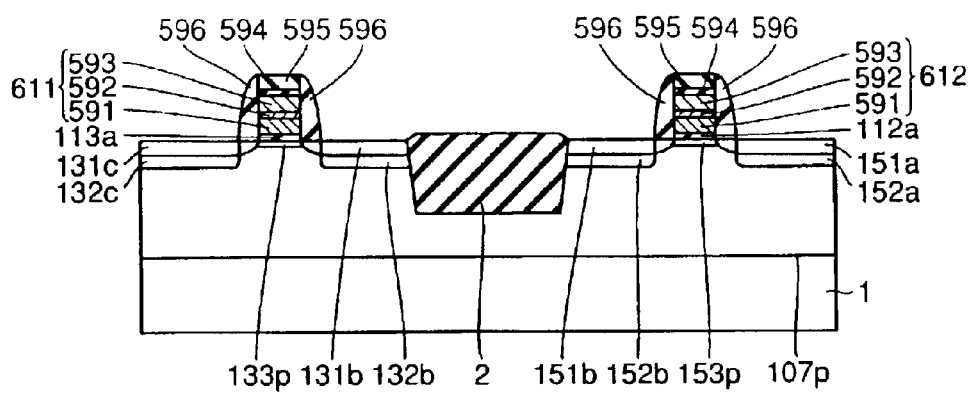

Referring to FIG. 37, a silicon nitride film is formed on silicon substrate 1. Etching back the entire surface of the silicon nitride film forms a sidewall nitride film 596 on the sidewalls of gate electrodes 611 and 612. Implantation of impurity ions into silicon substrate 1 under the conditions as in the first embodiment using sidewall nitride film 596 as a mask forms high-concentration impurity regions 132b, 132c, 152a, and 152b.

Figure 38:
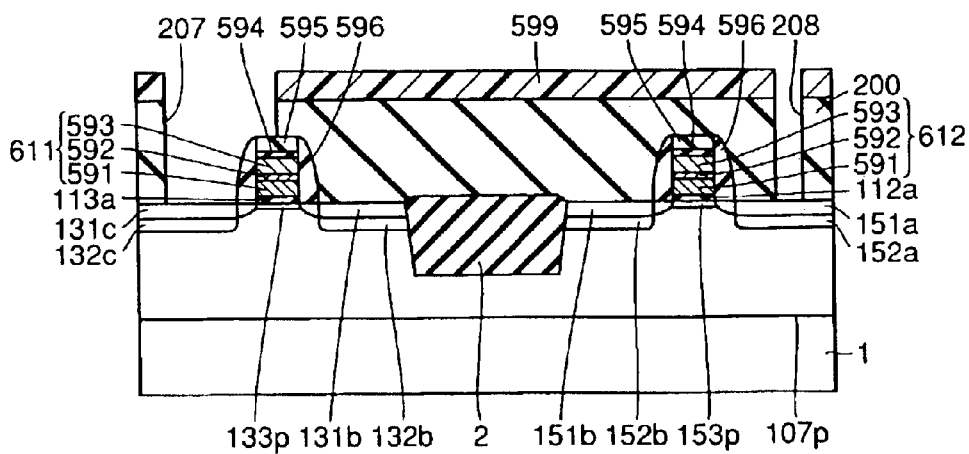
Figure 39:
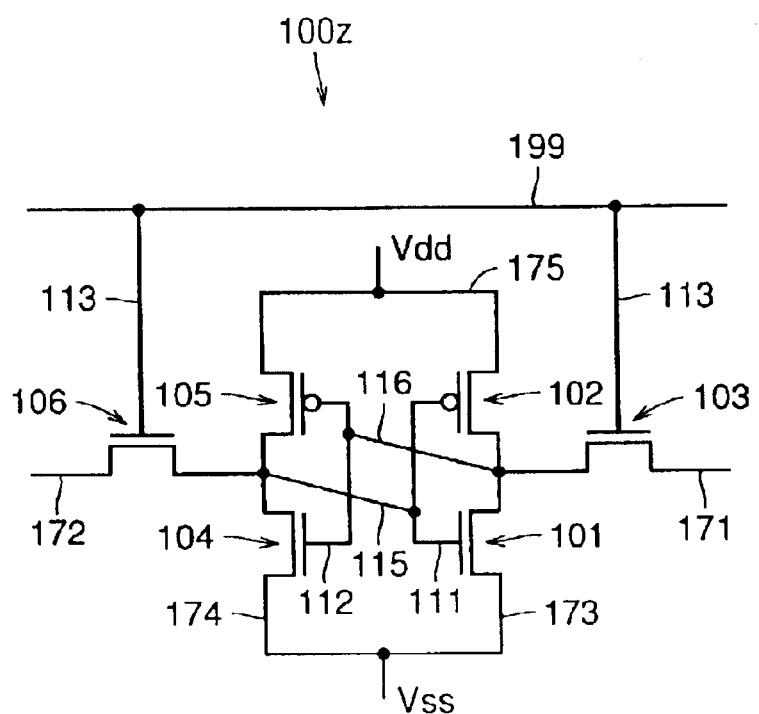
FIG. 39 is an equivalent circuit diagram showing a memory cell of a conventional SRAM.
Figure 40:
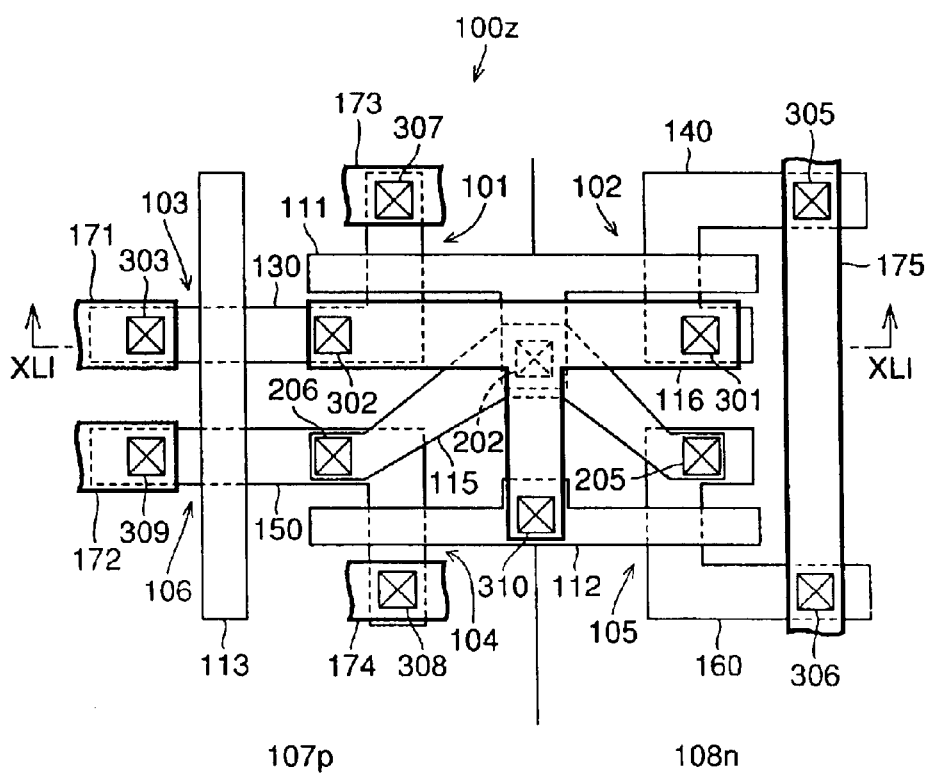
FIG. 40 is a plan view showing the conventional SRAM.
Figure 41:
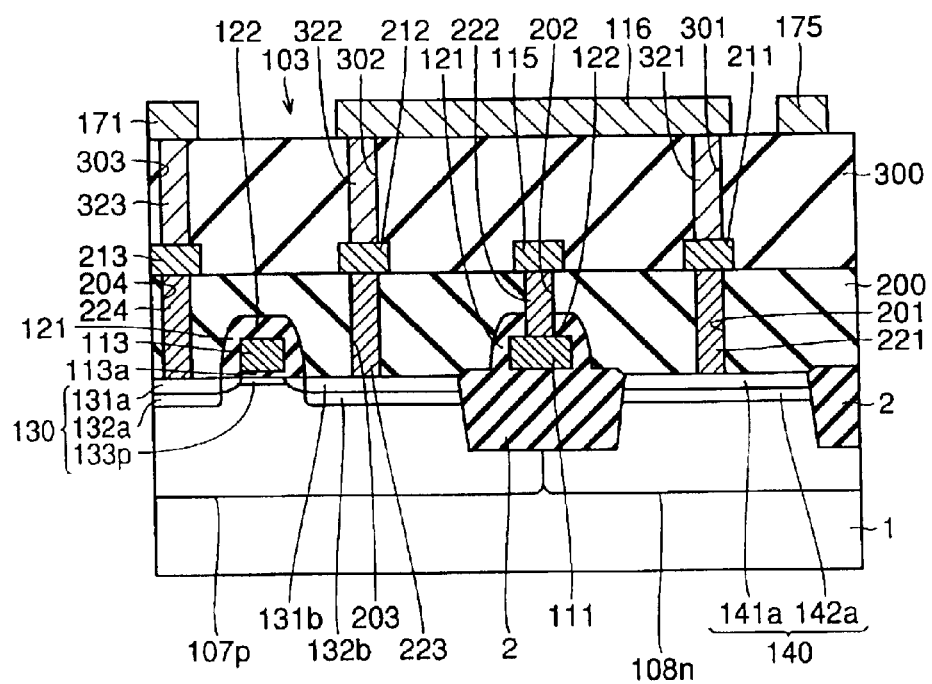
FIG. 41 is a cross sectional view taken along the line XLI—XLI in FIG. 40.
Figure 42:
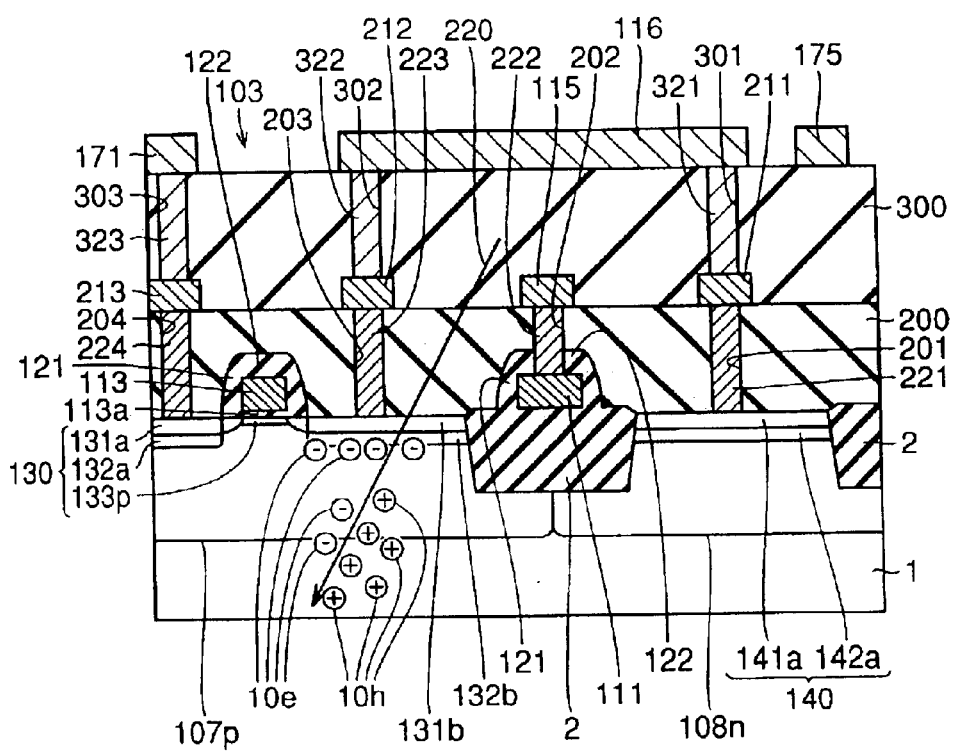
FIG. 42 is a diagram shown in conjunction with problems of the conventional SRAM.

Referring to FIG. 38, interlayer insulative film 200 is formed on silicon substrate. A resist pattern 599 is formed on interlayer insulative film 200. Interlayer insulative film 200 is etched in accordance with resist pattern 599. This forms contact holes 207 and 208. The sidewall of contact hole 207 is defined by sidewall nitride film 596.

Referring to FIG. 35, plug layers 227 and 228 are formed to fill in contact holes 207 and 208. Pad electrodes 217, 218 and storage node 115 are formed on interlayer insulative film 200. Interlayer insulative film 300 is formed on interlayer insulative film 200. Contact holes 307 and 308 are formed in interlayer insulative film 300, and plug layers 327 and 328 are formed to fill in contact holes 307 and 308. Ground nodes 173, 174 and storage node 116 are formed on interlayer insulative film 300 to complete memory cell 100g of the SRAM shown in FIG. 35.

In memory cell 100g of the SRAM having the above-described structure, gate electrode 611 connected to storage node 115 is arranged opposite to plug layer 227 through sidewall nitride film 596. Thus, gate electrode 611 and plug layer 227 are capacitively coupled. As a result, electric charges accumulated in gate electrode 611 are capacitively coupled to plug layer 227. Accordingly, any carriers caused by α rays would not affect the electric charges in gate electrode 611. Thus, loss of electric charges in gate electrode 611 is avoided to prevent soft errors. Further, plug layer 227 is connected to ground node 173 to have a constant potential, so that electric charges are stably retained.

Although the embodiment of the present invention have been described above, various modifications are possible to these embodiments. The memory cells of the first to the seventh embodiments can be combined to form a novel memory cell. Further, the types of ions to be implanted, implantation energy, dose or the like herein described are illustrative only and not be intended to limit the scope of the present invention.

According to the present invention, a static semiconductor memory device capable of preventing soft errors can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:

a semiconductor substrate;

a semiconductor region of a first conductivity type formed in said semiconductor substrate;

a semiconductor region of a second conductivity type formed in said semiconductor substrate to have contact with said semiconductor region of the first conductivity type; and a field effect transistor having a channel region of the first conductivity type formed in said semiconductor region of the first conductivity type, said semiconductor region of the second conductivity type being in contact with said semiconductor region of the first conductivity type and including a first extension region extending toward said channel region;

wherein a bottom of said first extension region and a bottom of said semiconductor region of the first conductivity type are substantially coplanar; and wherein a potential different from that of said semiconductor region of the first conductivity type is applied to said semiconductor region of said second conductivity type to attract carriers of the second conductivity type.

2. The static semiconductor memory device according to claim 1, wherein said semiconductor region of the second conductivity type further includes a second extension region covering said semiconductor region of the first conductivity type.

* * * * *